United States Patent
Kaijou et al.

[11] Patent Number: 5,972,527
[45] Date of Patent: *Oct. 26, 1999

[54] TRANSPARENT ELECTRICALLY CONDUCTIVE LAYER, ELECTRICALLY CONDUCTIVE TRANSPARENT SUBSTRATE AND ELECTRICALLY CONDUCTIVE MATERIAL

[75] Inventors: Akira Kaijou; Masashi Ohyama; Masatoshi Shibata; Kazuyoshi Inoue, all of Sodegaura, Japan

[73] Assignee: Idemitsu Kosan Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/446,584

[22] PCT Filed: Dec. 15, 1993

[86] PCT No.: PCT/JP93/01821

§ 371 Date: Nov. 6, 1995

§ 102(e) Date: Nov. 6, 1995

[87] PCT Pub. No.: WO94/13851

PCT Pub. Date: Jun. 23, 1994

[30] Foreign Application Priority Data

| Dec. 15, 1992 | [JP] | Japan | 4-334731 |
| Dec. 15, 1992 | [JP] | Japan | 4-334745 |
| Dec. 16, 1992 | [JP] | Japan | 4-336446 |
| Dec. 16, 1992 | [JP] | Japan | 4-336447 |

[51] Int. Cl.$^6$ ............................. C23C 14/08; H01B 1/08
[52] U.S. Cl. ................. 428/697; 204/192.1; 204/192.15; 204/192.29; 204/298.01; 204/298.02; 204/298.12; 204/298.13; 429/226; 252/518; 428/411.1; 428/412; 428/425.9; 428/432; 428/414; 428/480; 428/522; 428/523; 428/524; 428/699; 428/701; 428/702

[58] Field of Search ...................... 428/414, 480, 428/701, 702, 432, 411.1, 412, 425.9, 522, 523, 524, 699; 204/192.1, 192.15, 192.29, 298.01, 298.02, 298.12, 298.13; 427/226; 252/518

[56] References Cited

U.S. PATENT DOCUMENTS 4,849,252  7/1989  Arfsten et al. .

(List continued on next page.)

FOREIGN PATENT DOCUMENTS 59-119611  7/1984  Japan .

(List continued on next page.)

OTHER PUBLICATIONS

An English Language Excerpt (Abstract) of JP 61–205619, Transparent Electrically–Conductive Film Of Heat–Resistant Zinc Oxide, Japanese Appln. No. 60–46782 (Sep. 11, 1986).

Primary Examiner—Archene Turner
Attorney, Agent, or Firm—Frishauf, Holtz, Goodman, Langer & Chick, P.C.

[57] ABSTRACT

A transparent electrically conductive layer having practically sufficient electrical conductivity and light transmittance and having excellent resistance to moist heat and etching properties, and an electrically conductive transparent substrate utilizing the transparent electrically conductive layer, the transparent electrically conductive layer being formed of a substantially amorphous oxide containing indium (In) and zinc (Zn) as main cation components or a substantially amorphous oxide containing indium (In), zinc (Zn) and at least one other third element having a valence of at least 3, in which the atomic ratio of In, In/(In+Zn), is 0.50 to 0.90 or the atomic ratio of the total amount of the third element(s), (total third element)/(In+Zn+total third element (s)), when at least one other third element is contained, is 0.2 or less.

64 Claims, 1 Drawing Sheet

* A peak indicated by numeral 1 is assumed to be caused by $In_2O$ crystal.

A peak indicated by numeral 2 is assumed to be caused by In.

U.S. PATENT DOCUMENTS

| | | | |
|---|---|---|---|
| 5,105,291 | 4/1992 | Matsumoto et al. | |
| 5,206,089 | 4/1993 | Vilato et al. | 428/426 |
| 5,510,173 | 4/1996 | Pass et al. | 428/216 |

FOREIGN PATENT DOCUMENTS

| | | |
|---|---|---|
| 61-188817 | 2/1985 | Japan . |
| 60-220505 | 11/1985 | Japan . |
| 60-220506 | 11/1985 | Japan . |
| 61-205619 | 9/1986 | Japan . |
| 62-5602 | 1/1987 | Japan . |
| 62-157618 | 7/1987 | Japan . |
| 62-297462 | 12/1987 | Japan . |
| 63-201016 | 8/1988 | Japan . |
| 63-265818 | 11/1988 | Japan . |
| 1-207994 | 8/1989 | Japan . |
| 1-301537 | 12/1989 | Japan . |
| 2-98016 | 4/1990 | Japan . |
| 3-16954 | 1/1991 | Japan . |
| 3-50148 | 3/1991 | Japan . |
| 3-254009 | 11/1992 | Japan . |

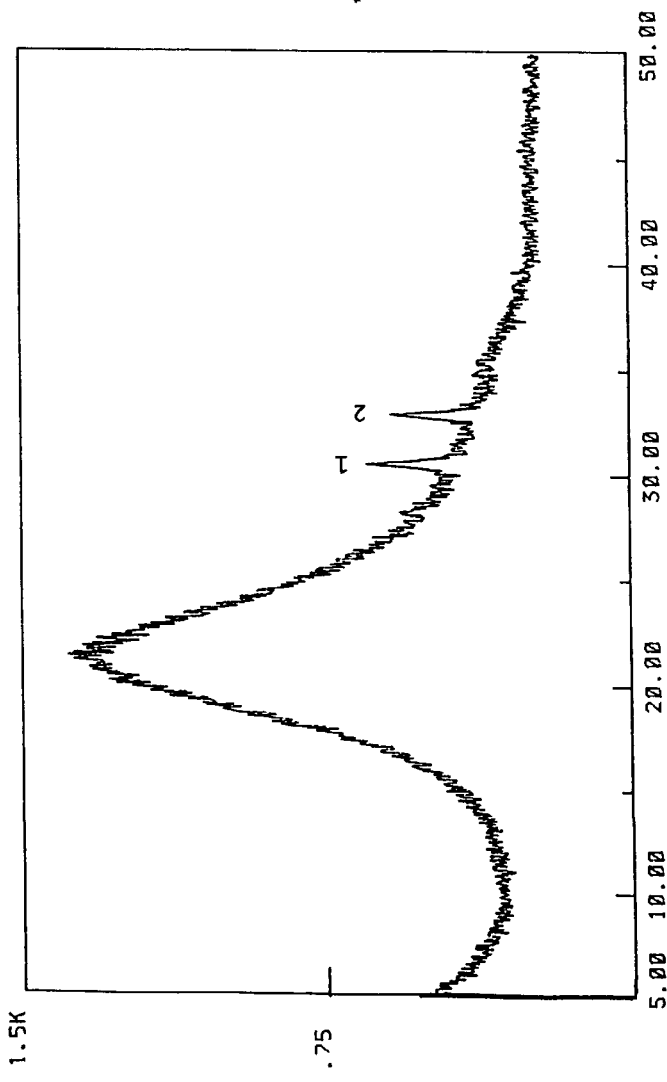
Fig. I
* A peak indicated by numeral 1 is assumed to be caused by $In_2O_3$ crystal.
A peak indicated by numeral 2 is assumed to be caused by In.

TRANSPARENT ELECTRICALLY CONDUCTIVE LAYER, ELECTRICALLY CONDUCTIVE TRANSPARENT SUBSTRATE AND ELECTRICALLY CONDUCTIVE MATERIAL

TECHNICAL FIELD

The present invention relates to a transparent electrically conductive layer, an electrically conductive substrate formed of the transparent electrically conductive layer, and an electrically conductive material suitable as a material for obtaining the above transparent electrically conductive layer.

TECHNICAL BACKGROUND

A liquid crystal display apparatus can be decreased in weight and thickness and actuated at a low voltage, and it is therefore actively introduced to office automation machines and equipment such as a personal computer, a word processor, etc. And, a liquid crystal display apparatus having the above advantages is inevitably designed toward a larger screen, an increase in the number of picture element pixels and higher preciseness, and there is desired a high-quality liquid crystal display apparatus free of display defects.

A liquid crystal display device has a sandwich structure in which a liquid crystal is sandwiched between mutually opposing two transparent electrodes, and the transparent. electrodes constitute one important element for obtaining a high-quality liquid crystal display device. The transparent electrode is fabricated, for example, by patterning a transparent electrically conductive layer formed on a transparent glass substrate, to a predetermined form by photolithography. In recent years, for further decreasing the weight of a display apparatus, it is under way to make attempts to substitute polymer films for the transparent glass substrate.

At present, an ITO electrode is the mainstream as a transparent electrode. An ITO layer which constitutes the base of the ITO electrode is formed by a sputtering method using ITO as a sputtering target. It is because an ITO layer not only has high transparency and low resistance but also has excellent etching properties (etching rate) and excellent adhesion to a substrate that a large number of ITO electrodes are used.

Generally, however, it is required to set the substrate temperature at 200–300° C. for obtaining an ITO layer having a low electric resistance and high transparency. When an ITO layer is formed in this manner, the ITO layer is crystallized. As a result, the etching properties are good, but cannot be said to be excellent. Further, when a polymer film or a resin substrate is used as a substrate, it is difficult to set the substrate temperature at 200–300° C., and it is therefore difficult to form an ITO layer having a low electric resistance and high transparency. The ITO layer can be improved in the etching properties by preparing the ITO layer as an amorphous one (see U.S. Pat. No. 5,105,291), while the amorphous ITO layer has a problem in that the electrical conductivity decreases. Further, since an ITO layer has relatively low resistance to moist heat, an ITO electrode obtained by shaping this ITO layer into a predetermined form has a problem in that the electrical conductivity and the light transmittance is liable to decrease with time while it is used. It markedly appears particularly in an amorphous ITO film that the resistance to moist heat is low so that the electrical conductivity and the light transmittance decrease with time.

The present invention has been made to provide a novel transparent electrically conductive layer which can replace the ITO layer having the above problems, and a novel electrically conductive transparent substrate which can replace an electrically conductive transparent substrate formed of the ITO layer. It is an object of the present invention to provide a transparent electrically conductive layer which has practically sufficient electrical conductivity and light transmittance and is excellent in resistance to moist heat and etching properties, and an electrically conductive transparent substrate formed of this transparent electrically conductive layer. It is another object of the present invention to provide an electrically conductive material suitable as a material for obtaining the above transparent electrically conductive layer.

The present inventors have made diligent studies expecting that a transparent electrically conductive layer having higher chemical stability than an ITO layer can be obtained by replacing Sn in ITO with other element. As a result, the present inventors have found that an oxide which is an amorphous oxide containing indium (In) and zinc (Zn) as main cation elements and having a ratio between In and Zn in a specific range has practically sufficient electrical conductivity and light transmittance and is excellent in resistance to moist heat and etching properties, and the completion of the present invention has been arrived at.

As an electrically conductive layer formed from an oxide containing indium and zinc as main cation elements, the following films (1) and (2) are known.

(1) A transparent electrically conductive layer of indium-containing zinc oxide, formed by a sputtering method using a sintered body formed from zinc oxide containing indium in an amount of 2 at % of zinc atoms, as a target, under the condition where the substrate temperature is room temperature (see JP-A-61-205619).

(2) A layer of indium oxide containing zinc oxide, obtained by forming a coating on a substrate surface by dip-coating a coating solution containing indium nitrate and zinc nitrate in an atomic ratio of indium, In/(In+Zn), of 0.80, and subjecting the coating to predetermined heat treatment (see JP-B-5-6289).

The transparent electrically conductive layer of the present invention can be easily obtained as one having excellent electrical conductivity over the above layers (1) and (2) when formed by like methods (a sputtering method and an coating and thermal decomposition method).

DISCLOSURE OF THE INVENTION

The transparent electrically conductive layer of the present invention is characterized in that it is formed of an amorphous oxide containing indium (In) and zinc (Zn) as main cation elements, and that the atomic ratio of In, In/(In+Zn), is 0.50 to 0.90 (this transparent electrically conductive layer will be referred to as "transparent electrically conductive layer I" hereinafter). Another transparent electrically conductive layer of the present invention is characterized in that it is a layer formed from an amorphous oxide containing, as main cation elements, at least ones of third elements having a valence of at least 3 (e.g., tin (Sn), aluminum (Al), antimony (Sb), gallium (Ga) and germanium (Ge)) in addition to In and Zn, that the atomic ratio of In, In/(In+Zn), is 0.50 to 0.90 and that the atomic ratio of the total amount of the above third elements (total third elements)/(In+Zn+total third elements) is 0.2 or less (this transparent electrically conductive film will be referred to as "transparent electrically conductive layer II" hereinafter).

The electrically conductive transparent substrate of the present invention is characterized in that the above transparent electrically conductive layer I or the above transparent electrically conductive layer II is formed on a transparent polymer substrate in the form of a film or a sheet directly or through at least a crosslinked resin layer (this electrically conductive transparent substrate will be referred to as "electrically conductive transparent film" hereinafter). Further, another electrically conductive transparent substrate of the present invention is characterized in that the above transparent electrically conductive layer I or the above transparent electrically conductive layer II is formed on a transparent glass substrate (this electrically conductive transparent substrate will be referred to as "electrically conductive transparent glass" hereinafter).

The electrically conductive material of the present invention includes the following electrically conductive materials a to b.

a. Material characterized in that it is a powder or a sintered body formed from an oxide containing indium (In) and zinc (Zn) as main cation elements and contains a hexagonal laminar compound of the general formula $In_2O_3(ZnO)_m$ (m=2–20) and that the atomic ratio of In, In/(In+Zn), is 0.1 to 0.9 (this electrically conductive material will be referred to as "electrically conductive material I" hereinafter).

The above electrically conductive material I may be substantially formed from at least one of hexagonal laminar compounds of the above general formula, or may be substantially formed from a material containing crystalline or amorphous $In_2O_3$ and/or ZnO in addition to at least one of hexagonal laminar compounds of the above formula. b. Material characterized in that it is a powder or a sintered body formed from an oxide containing, as main cation elements, at least one of third elements having a valence of at least 3 (e.g., tin (Sn), aluminum (Al), antimony (Sb), gallium (Ga) and germanium (Ge)) in addition to In and Zn, said oxide containing hexagonal laminar compound of the general formula $In_2O_3(ZnO)_m$ (m=2–20) containing at least one of the above third elements, that the atomic ratio of In, In/(In+Zn), is 0.1 to 0.9, and the atomic ratio of the total amount of the above third elements, (total third elements)/(In+Zn+total third elements), is 0.2 or less (this electrically conductive material will be referred to as "electrically conductive material II" hereinafter).

The above electrically conductive material II may be substantially formed from at least one of the above compounds, and may be formed from a material containing crystalline or amorphous $In_2O_3$ and/or ZnO in addition to at least one of the above compound.

BRIEF DESCRIPTION OF THE DRAWING

FIG. 1 is a graph showing the result of measurement of a transparent electrically conductive layer I obtained in Example 1 (calcining temperature 500° C., firing temperature 500° C.) by XRD (X-ray diffraction).

PREFERRED EMBODIMENTS FOR WORKING THE INVENTION

The present invention will be detailed hereinafter.

First, the electrically conductive layer I of the present invention will be explained. As described already, this electrically conductive layer I is formed from a amorphous oxide substantially containing In and Zn alone as main cation elements, and in this layer, the atomic ratio of In, In/(In+Zn), is 0.50 to 0.90. Oxygen in the above oxide may be partially missing in some cases. Further, this oxide includes oxides in all forms such as a mixture, a composition and a solid solution.

The reason for limiting the atomic ratio of In, In/(In+Zn), in the above transparent electrically conductive layer I is that when the above atomic ratio is less than 0.50, the electrical conductivity is low, and that when the above atomic ratio exceeds 0.90, the etching properties (etching rate) is low. Although differing depending upon methods of forming the layer, generally, the atomic ratio, In/(In+Zn), is preferably 0.60 to 0.90. The atomic ratio of In, In/(In+Zn), is more preferably 0.6 to 0.80 for a layer formed by a coating and thermal decomposition method, and 0.80 to 0.90 for a layer formed by the sputtering method. For a layer formed by the coating and thermal decomposition method, the above atomic ratio is particularly preferably 0.60 to 0.75.

Crystalline layers have poor electrical conductivity as compared with amorphous layers even if these layers have the same composition. The transparent electrically conductive layer I is therefore limited to amorphous layers. Further, when the atomic ratio, In/(In+Zn), of layers obtained by the coating and thermal decomposition method exceeds 0.80, the layers may show poor electrical conductivity in some cases.

The above oxide can be used as a transparent electrically conductive layer when formed as a thin layer. The thickness of this layer can be properly selected depending upon use and a material of a substrate on which the transparent electrically conductive layer is formed, while it is generally in the range of 3 nm to 3,000 nm. When the layer thickness is less than 3 nm, the electrical conductivity is liable to be insufficient; when it exceeds 3,000 nm, the light transmittance is liable to decrease.

The transparent electrically conductive layer I of the above oxide is a transparent electrically conductive Layer having practically sufficient electrical conductivity and light transmittance and having excellent resistance to moist heat and etching properties.

The above transparent electrically conductive layer I can be produced by any one of various methods such as a coating and thermal decomposition method, a sputtering method and a CVD method. For producing a layer at a low cost with easily controlling its composition, the production by a coating and thermal decomposition method is preferred. For producing a layer having high performance with high productivity, the production by a sputtering method is preferred.

When the transparent electrically conductive film I is produced by the coating and thermal decomposition method, there is prepared a coating solution in which an indium compound and a zinc compound are dissolved so that the atomic ratio of In, In/(In+Zn), is a predetermined value, the coating solution is applied to a predetermined substrate and fired at 300 to 650° C., and then the coating is reduction-treated to obtain the intended transparent electrically conductive layer I. The term "coating solution in which an indium compound and a zinc compound are dissolved so that the atomic ratio of In, In/(In+Zn), is a predetermined value" refers to a coating solution in which an indium compound and a zinc compound are dissolved so that the atomic ratio of In, In/(In+Zn), of a layer as a final product is an intended value in the range of 0.50 to 0.90.

The above coating solution contains a solvent and a stabilizer for the solution in addition to the above indium compound and zinc compound.

Specific examples of the above indium compound include carboxylates such as indium acetate, inorganic indium compounds such as indium chloride, and indium alkoxides such as indium ethoxide and indium propoxide. Specific examples of the zinc compound include carboxylates such as zinc acetate, inorganic zinc compounds such as zinc chloride, zinc fluoride and zinc iodide, and zinc alkoxides such as zinc methoxide, zinc ethoxide and zinc propoxide.

The above solvent can be selected from water, alcohols such as methanol, ethanol, isopropyl alcohol, 2-methoxyethanol and 2-ethoxyethanol and hydrocarbons such as toluene and benzene. The above stabilizer for the solution can be selected from alaknolamines such as monoethanolamine, diethanolamine and triethanolamine. Of these, 2-methoxyethanol is preferred as a solvent, and monoethanolamine is preferred as a stabilizer.

The above coating solution can be prepared by mixing predetermined amounts of the indium compound, the zinc compound, the solvent and the stabilizer. The order of mixing in this case is not specially limited. The mixing may be a mixing with stirring with a stirrer according to a conventional method, and the mixing may be carried out under heat.

The time for the stirring is preferably 0.01 to 100 hours. When it is less than 0.01 hour, it is difficult to obtain a homogeneous transparent solution. When it exceeds 100 hours, it results in poor economic performance. The time for the stirring is particularly preferably 0.1 to 10 hours. When the stirring is carried out under heat, the heating temperature is preferably up to 100° C. When it exceeds 100° C., the solvent evaporates to alter the solution concentration.

The concentration of the total content of In and Zn in the coating solution is preferably 0.01 to 10 mol %. When it is less than 0.01 mol %, the thickness of a coating formed by one coating operation is small, and it is required to carry out the coating operation many times, which results in poor economic performance. When the above concentration exceeds 10 mol %, a coating is nonuniform in thickness. The concentration of the total content of I and Zn is particularly preferably 0.1 to 5 mol %.

The concentration of the stabilizer in the coating solution is preferably 0.01 to 50 ml %. When it is less than 0.01 mol %, it is difficult to dissolve the indium compound and the zinc compound in the solvent. On the other hand, when it exceeds 50 mol %, carbon formed by the decomposition of the stabilizer during the firing remains in the layer to decrease the electrical conductivity of the layer. The concentration of the stabilizer is particularly preferably 0.1 to 10 mol %.

In the production of the transparent electrically conductive layer I by the coating and thermal decomposition method, the coating solution prepared as described above is applied to a substrate, and then fired at 300 to 650° C. The substrate may be selected from various substrates depending upon use. For example, the transparent substrate is selected from electrically insulating transparent materials such as soda-lime glass, lead glass, borosilicate glass, high silica glass, alkali-free glass, alkali glass, quartz glass and a highly heat-resistant transparent polymer. The substrate may have an undercoating layer. Specific examples of the undercoating layer include thin films of ZnO, $SiO_2$ and $TiO_2$.

The method for the application of the coating solution to the substrate is not specially limited, and it can be selected from various methods which have been used for producing a thin layer from a solution. Specific examples thereof include a spraying method, a dipping method, a spin coating method and a roll coating method.

Further, the firing method is not specially limited, and it includes a method of firing under atmospheric pressure, a method of firing under vacuum and a method of firing under pressure. The firing temperature is limited to 300 to 650° C. The reason for limiting the lower limit of the firing temperature to 300° C. is that when it is lower than 300° C., the decomposition of the material is insufficient or carbon formed by the decomposition of the solvent or stabilizer remains in the fired layer to decrease the electrical conductivity. On the other hand, the reason for limiting the upper limit of the firing temperature to 650° C. is that when it exceeds 650° C., a layer obtained is crystalline and the electrical conductivity of the layer is low. The firing temperature is preferably 300 to 600° C.

Although depending upon the firing temperature, the time for the firing is preferably 0.01 to 10 hours. When the time for the firing is less than 0.01 hour, the decomposition of the material is insufficient or carbon formed by the decomposition of the solvent or stabilizer remains in the fired layer to decrease the electrical conductivity. When it exceeds 10 hours, it is poor in economic performance. The time for the firing is particularly preferably 0.1 to 10 hours.

When a desired film thickness is not obtained by carrying out the operation of firing the applied coating once, the firing may be carried out a plurality of times as required.

In the production of the transparent electrically conductive film I by the coating and thermal decomposition method, the coating is reduction-treated after fired as described above. The reduction method can be selected from reduction with a reducing gas, reduction with an inert gas and reduction by firing under vacuum. The reducing gas is selected from hydrogen gas and steam of water. The inert gas is selected from nitrogen gas and argon gas. When the reduction is carried out under mild conditions, a mixed gas of an inert gas and oxygen gas may be used.

The temperature for the reduction is preferably 100 to 650° C. When the reduction temperature is lower than 100° C., it is difficult to sufficiently carry out the reduction. When it exceeds 650° C., the film is crystalline to decrease the electrical conductivity. The reduction temperature is particularly preferably 200 to 500° C. Although depending upon the reduction temperature, the time for the reduction is preferably 0.01 to 10 hours. When the reduction time is less than 0.01 hour, it is difficult to sufficiently carry out the reduction. When it exceeds 10 hours, it is poor in economic performance. The reduction time is particularly preferably 0.1 to 10 hours.

The intended transparent electrically conductive layer I of the present invention is obtained by carrying out steps up to the reduction treatment as described above.

The sputtering method as other method suitable for the production of the transparent electrically conductive layer I will be explained hereinafter.

The sputtering target used for forming the transparent electrically conductive layer II on a predetermined substrate by a sputtering method may be any target which can give the transparent electrically conductive layer I. Various sputtering targets may be used depending upon the composition (atomic ratio of In (In/(In+Zn)) of the intended transparent electrically conductive layer I and sputtering conditions.

Specific examples of the sputtering target used for forming the transparent electrically conductive layer I on a predetermined substrate by an RF or DC magnetron sputtering (to be sometimes referred to as "direct sputtering) method include the following sputtering targets (i) and (ii).

(i) Target which is a sintered body formed from an oxide containing indium and zinc as main components and which has a predetermined value as an atomic ratio of In, In/(In+Zn). The term "target which has a predetermined value as an atomic ratio of In, In/(In+Zn)" refers to a target which gives a final layer in which the atomic ratio of In, In/(In+Zn), is a predetermined value in the range of 0.50 to 0.90. Specifically, there is used a target in which the atomic ratio of In, In/(In+Zn), is an intended value in the range of 0.45 to 0.9.

The above target of a sintered body may be a sintered body formed from a mixture of indium oxide and zinc oxide; may be a sintered body formed substantially from at least one of hexagonal laminar compounds of $In_2O_3(ZnO)_m$ (m=2–20) (this sintered body comes under the electrically conductive material I of the present invention); or may be a sintered body formed. substantially from at least one of the above hexagonal laminar compounds and $In_2O_3$ and/or ZnO (this sintered body comes under the electrically conductive material I of the present invention). The reason for limiting m to 2–20 in the above formula for the hexagonal laminar compounds is that when m is outside the above range, no hexagonal laminar compound is formed.

(ii) Sputtering target formed from an oxide-containing disk and at least one oxide-containing tablets arranged on the disk.

The oxide-containing disk may be one formed substantially from indium oxide or zinc oxide; may be a sintered body formed substantially from at least one of hexagonal laminar compounds of $In_2O_3(ZnO)_m$ (m=2–20) (this sintered body comes under the electrically conductive material I of the present invention); or may be a sintered body formed substantially from at least one of hexagonal laminar compounds of $In_2O_3(ZnO)_m$ (m=2–20), and further added $In_2O_3$ and/or ZnO (this sintered body comes under the electrically conductive material I of the present invention).

Those similar to the above oxide-containing disk can be used as the oxide-containing tablet.

The compositions and amounts of the oxide-containing disk and the oxide-containing tablet are properly determined such that the atomic ratio of In, In/(In+Zn), in a layer which is to be finally obtained is an intended value in the range of 0.50 to 0.90.

Each of the above sputtering targets (i) and (ii) preferably has a purity of at least 98%. When the purity is less than 98%, the resultant film sometimes shows decreased resistance to moist heat, decreased electrical conductivity or decreased light transmittance due to the presence of impurities. The purity is more preferably at least 99%, further preferably at least 99.9%. When a target of a sintered body is used, the relative density of the target is preferably at least 70%. When the relative density is less than 70%, the layer-forming rate is liable to decrease or the layer is liable to have degraded properties. The relative density is more preferably at least 85%, further preferably at least 90%.

The above sputtering target (i) and the above oxide-containing disk and oxide-containing tablet (ii) can be produced as follows, for example.

That is, an indium compound and a zinc compound are mixed, the resultant mixture is calcined to obtain a calcination product, and the calcination product is shaped and sintered to obtain an intended sintered body of an oxide. The above indium compound and the zinc compound used as raw materials may be oxides or those which become oxides after fired (oxide precursors).

The indium oxide precursor and the zinc oxide precursor include sulfides, sulfates, nitrates, halides (chlorides, bromides, etc.), carbonates, organic acid salts (acetates, oxalates, propionates, naphthenates, etc.), alkoxides (methoxides, ethoxides, etc.) and organic metal complexes (acetylacetonates, etc.) of indium and zinc. Of these, it is preferred to use nitrates, organic acid salts, alkoxides or organic metal complexes for accomplishing complete thermal decomposition at a low temperature so that no impurities remain.

Further, the above mixture of the indium compound and the zinc compound is preferably obtained by the following (A) solution method (coprecipitation method) or (B) physical mixing method.

(A) Solution Method (coprecipitation method)

In this method, a solution of the indium compound and the zinc compound is prepared, or a solution of at least the indium compound and a solution of at least the zinc compound are prepared, and in addition to the solution(s), a solution of a precipitant is prepared. The above solutions are simultaneously or consecutively placed and mixed in a separately prepared container (which may contain a solvent as required) with stirring, to form a coprecipitate of the indium compound and the zinc compound.

Further, a solution of a precipitant may be added to a solution of the indium compound and the zinc compound, or the procedure may be effected reversely.

The solution method will be detailed below with reference to a case where a solution of the indium compound and the zinc compound and a solution of a precipitant are separately prepared and these two solutions are placed and mixed in another container containing a solvent with stirring, to form a precipitate.

First, a solution of the indium compound and the zinc compound in a proper solvent (to be referred to as "'solution A" hereinafter) is prepared. The solvent can be properly selected according to the solubility of the indium compound or the zinc compound. For example, it is selected from water, alcohols and aprotic polar solvents (DMSO, NMP, sulforane and THF). In view of the low solubility of a precipitate to be formed, preferred are alcohols having 1 to 5 carbon atoms (methanol, ethanol, isopropanol, methoxyethanol and ethylene glycol). The concentration of each metal in Solution A is preferably 0.01 to 10 mol/liter. The reason therefor is that when it is less than 0.01 mol/liter, the productivity is poor, and that when it exceeds 10 mol/liter, a heterogeneous precipitate is formed.

Further, added acids (nitric acid and hydrochloric acid) acetylacetones, polyhydric alcohols (ethylene glycol) and ethanolamines (monoethanolamine and diethanolamine) may be added in an amount approximately 0.01 to 10 times as large as the metal amount in the solution, as required depending upon various solvents, for promoting the dissolving of the raw materials.

A solution of a precipitant (to be referred to as "Solution B" hereinafter) is prepared together with the above Solution A. The precipitant to be dissolved in Solution B is selected from alkalis (sodium hydroxide, potassium hydroxide, sodium carbonate, potassium carbonate, sodium bicarbonate, potassium bicarbonate, ammonium hydroxide, ammonium carbonate and ammonium bicarbonate), and organic acids (formic acid, oxalic acid and citric acid). The precipitate is formed as a hydroxide, an inorganic acid salt or an organic acid salt depending upon the precipitant.

The solvent for dissolving the precipitant and the solvent to be placed in a container in which a precipitate is formed are selected from the above solvents used for dissolving the indium compound and the zinc compound.

The solvents used for the above various solutions are preferably the same in kind, while different solvents may be used.

In this method, a precipitate is formed by any one of the above means, while the temperature at which the precipitate is formed can be a temperature equal to, or higher than, the melting point of the solvent and equal to, or lower than, the boiling point of the solvent. The formed precipitate may be aged for 1 to 50 hours after formed.

The so-obtained precipitate is then solid-liquid separated and dried. The solid-liquid separation of the precipitate is carried out by a conventional method such as centrifugal separation or filtration. After the solid-liquid separation, it is preferred to fully wash the precipitate with the same solvent as that used for Solution A or Solution B or other solvent for removing anion and alkali metal ion from the precipitate. The drying after the solid-liquid separation is preferably carried out at 40 to 200° C. for 1 to 100 hours. When the drying temperature is lower than 40° C., the drying takes too long a time. When it is higher than 200° C., particles of the precipitate are liable to aggregate.

(B) Physical Mixing Method

This method can be carried out in all the cases when the above indium compound is indium oxide or its precursor (regardless of being water-soluble or sparingly soluble) and when the above zinc compound is zinc oxide or its precursor regardless of being water-soluble or sparingly soluble). In this method, the indium compound and the zinc compound are placed in a mixer such as a ball mill, a jet mill or a pearl mill and. these two compounds are homogeneously mixed. The time for the mixing is preferably 1 to 200 hours. When the mixing time is less than 1 hour, the homogeneous mixing is liable to be insufficient. When it exceeds 200 hours, the productivity is poor. The mixing time is particularly preferably 10 to 120 hours.

A mixture of the above indium compound and zinc compound is obtained by the above solution method or physical mixing method, and then this mixture is calcined. Although variously differing relative to temperature and time, this calcination step is preferably carried out at 200 to 1,200° C. for 1 to 100 hours. When the temperature is lower than 200° C. or when the time is less than 1 hour, the thermal decomposition of the indium compound and the zinc compound is insufficient. When the temperature is higher than 1,200° C. or when the time exceeds 100 hours, particles are sintered to form coarse particles. Particularly preferably, the calcining temperature is 800 to 1,200° C. and the calcining time is 2 to 50 hours.

After the above calcination, the calcination product is preferably milled, and it may be reduction-treated before or after it is milled.

The calcination product is preferably milled with a ball mill, a roll mill, a pearl mill or a jet mill so that it has a particle diameter of 0.01 to 1.0 $\mu$m. When the particle diameter is less than 0.01 $\mu$m, the powder is liable to aggregate and is difficult to handle. Moreover, it is difficult to obtain a dense sintered body. When it exceeds 1.0 $\mu$m, it is difficult to obtain a dense sintered body. A mixture which is repeatedly calcined and milled can give a sintered body having a uniform composition.

The reduction method for the reduction treatment includes reduction using a reducing gas, firing in vacuum and reduction using an inert gas. When the reduction using a reducing gas is carried out, the reducing gas is selected from hydrogen, methane, Co and mixture of these gases with oxygen. When the reduction using an inert gas is carried out, the inert gas is selected from nitrogen, argon and mixtures of these gases with oxygen. The reduction temperature is preferably 100 to 800° C. When it is lower than 100° C., it is difficult to sufficiently carry out the reduction. When it exceeds 800° C., zinc oxide evaporates to change the composition. The reduction temperature is particularly preferably 200 to 800° C. Although depending upon the reduction temperature, the time for the reduction is preferably 0.01 to 10 hours. When it is less than 0.01 hour, it is difficult to sufficiently carry out the reduction. When it exceeds 10 hours, it is poor in economic performance. The reduction time is particularly preferably 0.05 to 5 hours.

The above-obtained calcination product (including a powder of the calcination product) is then shaped and sintered.

Of the powders or calcination products (including reduction-treated product) obtained by the above calcination, the powder or calcination product which is treated at a relatively high temperature is formed of an oxide containing indium (In) and zinc (Zn) as main cation elements, said oxide further containing a hexagonal laminar compound of the general formula $In_2O_3(ZnO)_m$ (m=2–20) and having an atomic ratio of In, In/(In+Zn), of 0.1 to 0.9. This powder or calcination product comes under the electrically conductive material I of the present invention.

The above-obtained calcination powder is shaped by molding, casting or injection molding. For obtaining a sintered body having a high sintering density, the calcination powder is preferably shaped by CIP (cold isostatic pressing) and subjected to sintering treatment to be described later. The powder may be shaped in various forms suitable as a target. For the shaping, shaping aids such as PVA (polyvinyl alcohol), MC (methyl cellulose), polywax and oleic acid may be used.

The shaped body is sintered by firing under atmospheric pressure or HIP (hot isotactic pressing). The sintering temperature can be equal to, or higher than, a temperature at which the indium compound and the zinc compound are thermally decomposed to form an oxide, and it is generally preferably 800 to 1,700° C. When the temperature exceeds 1,700° C., zinc oxide and indium oxide sublime to alter the composition. The sintering temperature is particularly preferably 1,200 to 1,700° C. Although depending upon the sintering temperature, the time for sintering is preferably 1 to 50 hours, particularly preferably 2 to 10 hours.

The sintering may be carried out in a reducing atmosphere, and the reducing atmosphere includes atmospheres of reducing gases such as $H_2$, methane and CO and inert gases such as Ar and $N_2$. In this case, zinc oxide and indium oxide easily evaporate, and it is therefore preferred to carry out the sintering under heat by HIP sintering, etc.

The sintering is carried out as above, whereby the intended target can be obtained.

When the transparent electrically conductive layer I of the present invention is formed on a predetermined substrate by a direct sputtering (RF or DC magnetron sputtering) method using the above sputtering target (i) or (ii), the material for the substrate is not specially limited, and the substrate can be selected from substrates of various materials as required. In this case, since a layer can be formed while the substrate temperature is maintained at a relatively low temperature, the substrate can be selected from various substrates in kind as compared with a case where the transparent electrically conductive layer I is formed by the above coating and thermal decomposition method. For example, the transparent substrate is selected from substrates formed of electrically insulating transparent polymers such as polycarbonate, polyarylate, polyester, polystyrene, a polyethersulfone-containing resin, an amorphous polyolefin and an acrylic resin, and substrates formed of electrically insulating transparent glass such as soda-lime glass, lead glass, borosilicate glass, high silica glass and alkali-free glass.

The substrate may have an undercoating layer. Specific examples of the undercoating layer include thin films of $ZnO$, $SiO_2$ and $TiO_2$. Further, when the substrate is selected from substrates formed of the electrically insulating transparent polymers, this substrate may have a crosslinked resin layer. Specific examples of the crosslinked resin layer includes layers of an epoxy resin, a phenoxyether resin and an acrylic resin. Further, an adhesive layer and a gas barrier layer may be formed between the transparent polymer substrate and the crosslinked resin layer. The material for the adhesive layer includes epoxy-, acrylurethane-, and phenoxyether-containing adhesives. The material for the gas barrier layer includes an ethylene-vinyl alcohol copolymer, polyvinyl alcohol, polyacrylonitrile, polyvinylidene chloride and polyvinylidene fluoride.

The conditions for carrying out the sputtering differ depending upon a sputtering method and the characteristics of an apparatus used, and are therefore difficult to uniformly determine. When the sputtering is carried out by a DC magnetron sputtering method, the conditions are preferably set as follows.

Vacuum degree and voltage charged to target

The vacuum degree in sputtering is approximately $1 \times 10^{-4}$ to $5 \times 10^{-2}$ Torr (approximately $1.3 \times 10^{-2}$ to $6.7 \times 10^{0}$ Pa), more preferably approximately $2 \times 10^{-4}$ to $1 \times 10^{-2}$ Torr (approximately $2.7 \times 10^{-2}$ to $1.3 \times 10^{0}$ Pa), further preferably approximately $3 \times 10^{-4}$ to $5 \times 10^{-3}$ Torr (approximately $4.0 \times 10^{-2}$ to $6.7 \times 10^{-1}$ Pa). The voltage for charging the target is preferably 200 to 500 V.

When the vacuum degree in sputtering is less than $1 \times 10^{-4}$ Torr (the pressure is lower than $1 \times 10^{-4}$ Torr), the stability of plasma is poor. When it is higher than $5 \times 10^{-2}$ Torr (the pressure is higher than $5 \times 10^{-2}$ Torr), the voltage charged to the sputtering target cannot be increased. When the voltage charged to the target is less than 200 V, it is difficult to obtain a good-quality thin film, or the film-forming rate is limited, in some cases.

Ambient gas

As the ambient gas, preferred is a mixture of an inert gas such as argon gas with oxygen gas. When argon gas is used as an inert gas, generally, the mixing ratio (volume ratio) of this argon gas : oxygen gas is preferably 0.5:0.5–0.99:0.01.

For obtaining a good-quality thin film, it is required to accurately control the mixing ratio.

Substrate temperature

The substrate temperature (temperature of substrate) can be properly set at a temperature in the range of room temperature to a temperature at which the substrate is free from deformation or alteration under heat, depending upon the heat resistance of the substrate. As the temperature for the heating increases, the production cost increases. When a polymer substrate is used as a substrate, the substrate temperature is preferably between room temperature and 200° C. When a glass substrate is used, it is preferably between room temperature and 400° C.

The transparent electrically conductive layer I can be formed on a predetermined substrate not only by the above sputtering method, but also by a reactive sputtering method. The sputtering target used in this case is specifically a target which is formed from an alloy of indium and zinc and has an atomic ratio of In, $In/(In+Zn)$, of a predetermined value. The term "target which has an atomic ratio of In, $In/(In+Zn)$, of a predetermined value" refers to a target which gives a final layer having an atomic ratio of In, $In/(In+Zn)$, of an intended value in the range of 0.50 to 0.90.

The above alloy target can be obtained, for example, by dispersing a predetermined amount of zinc powder or chips in molten indium and cooling the dispersion. The alloy target preferably has a purity of at least 98% for the same reasons as those described with regard to the sputtering targets (i) and (ii). The purity is more preferably at least 99%, further preferably at least 99.9%.

The reactive sputtering sometimes greatly depends upon an apparatus used, and it is therefore difficult to uniformly determine the conditions for carrying out the reactive sputtering with the above alloy target. The layer-forming conditions are therefore properly set depending upon the characteristics of an apparatus used, while the layer-forming conditions are preferably the same conditions as those in the above DC magnetron sputtering.

The transparent electrically conductive layer II of the present invention will be explained hereinafter.

As already described, the transparent electrically conductive layer II is a layer formed from an amorphous oxide containing, as main cation elements, at least one of third elements having a valence of at least 3 (e.g., tin (Sn), aluminum (Al), antimony (Sb), gallium (Ga) and germanium (Ge)) in addition to In and Zn, and in this layer, the atomic ratio of I, $In/(In+Zn)$ is 0.50 to 090, and the atomic ratio of the total amount of the above third elements, (total third elements)/(In+Zn+total third elements), is 0.2 or less.

The reason for limiting the atomic ratio of In, $In/(In+Zn)$, in the transparent electrically conductive layer II to 0.50 to 0.90 is the same as the reason explained in the description of the transparent electrically conductive layer I. Although differing depending upon methods of forming the layer, generally, the atomic ratio, $In/(In+Zn)$, is preferably 0.60 to 0.90. The atomic ratio of In, $In/(In+Zn)$, is more preferably 0.6 to 0.80 for a layer formed by the coating and thermal decomposition method, and 0.80 to 0.90 for a layer formed by the sputtering method. For a layer formed by the coating and thermal decomposition method, the above atomic ratio is particularly preferably 0.60 to 0.75.

The reason for limiting the atomic ratio of the total amount of third elements, (total third elements)/(In+Zn+total third elements), to 0.2 or less is that when the atomic ratio of the total amount of third elements exceeds 0.2, ion scattering takes place to decrease the electrical conductivity of the layer to excess. The atomic ratio of the total amount of third elements is preferably 0.10 or less, particularly preferably 0.02 to 0.10.

Like the transparent electrically conductive layer I, crystalline layers have poor electrical conductivity as compared with amorphous layers even if these layers have the same composition. The transparent electrically conductive layer II is also therefore limited to amorphous layers. Further, when the atomic ratio, $In/(In+Zn)$, of layers obtained by the coating and thermal decomposition method exceeds 0.80, the layers may show poor electrical conductivity in some cases.

The above amorphous oxide can be used as a transparent electrically conductive layer when formed as a thin layer. The thickness of this layer can be properly selected depending upon use and a material of a substrate on which the transparent electrically conductive layer II is formed, while it is generally in the range of 3 nm to 3,000 nm like the transparent electrically conductive layer I. When the layer thickness is less than 3 nm, the electrical conductivity is liable to be insufficient. When it exceeds 3,000 nm, the light transmittance is liable to decrease.

Like the transparent electrically conductive Layer I, the transparent electrically conductive layer II of the above amorphous oxide is a transparent electrically conductive layer having practically sufficient electrical conductivity and light transmittance and having excellent resistance to moist heat and etching properties.

The above transparent electrically conductive layer II can be also produced by any one of various methods such as an coating and thermal decomposition method, a sputtering method and a CVD method. For the same reasons as those concerning the transparent electrically conductive layer I, the production by an coating and thermal decomposition method or a sputtering method is preferred. Of the above-described third elements, Sn is particularly preferred. When Sn is used, the electrical conductivity is further improved.

The production of the transparent electrically conductive layer II by the coating and thermal decomposition method differs from the production of the transparent electrically conductive layer I by the coating and thermal decomposition method in that there is prepared a coating solution containing a predetermined amount of a compound of at least one of third elements having a valence of at least 3 (e.g., tin (Sn), aluminum (Al), antimony (Sb), gallium (Ga) and germanium (Ge)) in addition to the indium compound and the zinc compound. However, it is the same as the production of the transparent electrically conductive layer I in other points, i.e., the kinds of the indium compound and the zinc compound, the method of preparing the coating solution, the kind of the substrate, the firing method and the reducing method.

For the same reason as that in the case of obtaining the transparent electrically conductive layer I by the coating and thermal decomposition method, the concentration of the total content of In, Zn and the third element(s) (Sn, Al, Sb, Ga, Ge) in the coating solution is preferably 0.01 to 10 mol %, particularly preferably 0.1 to 5 mol %. The "predetermined amount of a compound of third element" refers to an amount which can give a film in which the atomic ratio of the total amount of third elements (Sn, Al, Sb, Ga, Ge, etc.), (total third elements)/(In+Zn+total third elements), is an intended value equal to, or smaller than, 0.2.

Specific examples of the Sn compound used as a compound of the third element in the production of the transparent electrically conductive layer II by the coating and thermal decomposition method include tin acetate (valence of 2), dimethoxytin, diethoxytin, dipropoxytin, dibutoxytin, tetramethoxytin, tetraethoxytin, tetrapropoxytin, tetrabutoxytin, tin chloride (valence of 2) and tin chloride (valence of 4). Of these compounds, the tin compounds whose tin has a valence of 2 are converted to tin compounds whose tin has a valence of 4 in a firing step.

Specific examples of the Al compound include aluminum chloride, trimethoxyaluminum, triethoxyaluminum, tripropoxyaluminum and tributoxyaluminum.

Specific examples of the Sb compound include antimony trichloride (valence of 3), antimony chloride (valence of 5), trimethoxyantimony, triethoxyantimony, tripropoxyantimony and tributoxyantimony.

Specific examples of the Ga compound include gallium chloride (valence of 3), trimethoxygallium, triethoxygallium, tripropoxygallium and tributoxygallium.

Specific examples of the Ge compound include germanium chloride (valence of 4), tetramethoxyqermanium, tetraethoxygermanium, tetrapropoxygermanium and tetrabutoxygermanium.

The production of the transparent electrically conductive layer II by the sputtering method can be carried out in the same manner as in the production of the transparent electrically conductive layer I by the sputtering method (RF or DC magnetron sputtering method and reactive sputtering method) except for a point where the composition of the target used is different.

Specific examples of the sputtering target, used for forming the transparent electrically conductive layer II on a predetermined substrate by the direct sputtering (RF or DC magnetron sputtering) method are the following sputtering targets (iii) and (iv).

(iii) Target which is a target of a sintered body formed from an oxide containing at least one of third elements having a valence of at least 3 (e.g., Sn, Al, Sb, Ga and Ge) in addition to indium oxide and zinc oxide, and which has predetermined values as an atomic ratio of In, In/(In+zn), and as an atomic ratio of the total amount of third elements, (total third elements)/(In+Zn+total third elements). The term "target which has a predetermined value as an atomic ratio of In, In/(In+Zn)" refers to a target which gives a final layer in which the atomic ratio of In, In/(In+Zn), is a predetermined value in the range of 0.50 to 0.90. Specifically, there is used a target in which the atomic ratio of In, In/(In+Zn), is an intended value in the range of 0.45 to 0.9. The term "target which has a predermined value as an atomic ratio of the total amount of third elements, (total third elements)/ (In+zn+total third elements)" refers to a target which gives a final layer in which the atomic ratio of the total amount of third elements, (total third elements)/(In+Zn+total third elements), is a predetermined value equal to, or less than, 0.2.

The above target of a sintered body may be a sintered body formed substantially from a mixture of indium oxide, zinc oxide and an oxide of at least one of third elements; may be a sintered body formed substantially from at least one of compound prepared by incorporating at least one of the above third elements to hexagonal laminar compounds of $In_2O_3(ZnO)_m$ (m=2–20) (this sintered body comes under the electrically conductive material II of the present invention); or may be a sintered body formed substantially from at least one of the above compounds, and added further $In_2O_3$ and ZnO (this sintered body comes under the electrically conductive material II of the present invention).

(iv) Sputtering target formed from an oxide-containing disk and at least one oxide-containing tablets arranged on the disk.

The oxide-containing disk may be one formed substantially from indium oxide or zinc oxide; may be one formed substantially from a mixture of an oxide of at least one of third elements having a valence of at least 3 (e.g., Sn, Al, Sb, Ga and Ge) with $In_2O_3$ and/or ZnO; may be a sintered body formed substantially from a compound prepared by incorporating at least one of the above third elements to at least one of hexagonal laminar compounds of $In_2O_3(ZnO)_m$ (m=2–20) (e.g, said compound being a hexagonal laminar compound of indium oxide-zinc oxide-aluminum oxide $Zn_mInAlO_{m+3}$ (m=2–7) or hexagonal laminar compound of indium oxide.zinc oxide.gallium oxide of $Zn_mInGaO_{m+3}$ (m=2–7)) (this sintered body comes under the electrically conductive material II of the present invention); or may be a sintered body formed substantially from at least one of compound prepared by incorporating at least one of the above third elements into the hexagonal laminar compound of $In_2O_3(ZnO)_m$ (m=2–20), and $In_2O_3$ and/or ZnO both of which are added to at least one of said third element-containing hexagonal laminar compound (this sintered body comes under the electrically conductive material II of the present invention).

Those similar to the above oxide-containing disk can be used as the oxide-containing tablet. Or, there may be used a tablet formed substantially from a spinel structure compound of $Zn_2SnO_4$, $Zn_7Sb_2O_{12}$ or $ZnAl_2O_4$ or a tablet formed substantially from a tri-rutile structure compound of $ZnSb_2O_6$.

It is sufficient that the third element is contained in at least one of the oxide-containing disk and the oxide-containing tablet, and the compositions and amounts of the oxide-containing disk and the oxide-containing tablet are properly determined such that the atomic ratio of In, In/(In+Zn), in a layer which is to be finally obtained is an intended value in the range of 0.50 to 0.90 and that the atomic ratio of the total amount of third elements, (total third elements)/(In+Zn+ total third elements) is an intended value equal to, or less than, 0.2.

Each of the above sputtering targets (iii) and (iv) preferably has a purity of at least 98%. When the purity is less than 98%, the resultant film sometimes shows decreased resistance to moist heat, decreased electrical conductivity or decreased light transmittance due to the presence of impurities. The purity is more preferably at least 99%, further preferably at least 99.9%. When a target of a sintered body is used, the relative density of the target is preferably at least 70%. When the relative density is less than 70%, the layer-forming rate is liable to decrease or the layer is liable to have degraded properties. The relative density is more preferably at least 85%, further preferably at least 90%.

The above sputtering target (iii) and the above oxide-containing disk and oxide-containing tablet (iv) can be obtained, for example, in the same manner in the production of the above sputtering target (i) and the above oxide-containing disk and oxide-containing tablet (ii) in the same manner as in the solution method (coprecipitation method) except that a solution containing a predetermined amount of a compound of intended third element in addition to the indium compound and the zinc compound is allowed to react with an alkaline solution to form a precipitate, or in the same manner as in the above physical mixing method except that a predetermined amount of oxide of intended third element or a compound which forms an oxide of intended third element when fired is added to the starting materials to obtain a mixture.

For example, when the above materials containing tin (Sn) as a third element are produced by the solution method, the tin compound is selected from tin acetate, tin oxalate, tin alkoxides (dimethoxytin, diethoxytin, dipropoxytin, dibutoxytin, tetramethoxytin, tetraethoxytin, tetrapropoxytin and tetrabutoxytin), tin chloride, tin fluoride, tin nitrate and tin sulfate, and is used in a desired amount. When the above materials containing tin (Sn) as a third element are produced by the physical mixing method, tin oxide or a compound which forms tin oxide when fired, specifically, any one of the above compounds used in the solution method, is used in a desired amount. Those tin compounds whose tin has a valence of 2 are converted to tin compounds whose tin has a valence of 4 in a firing step.

When the above materials containing aluminum (Al) as a third element are produced by the solution method, the aluminum compound is selected from aluminum chloride, aluminum alkoxides (trimethoxyaluminum, triethoxyaluminum, tripropoxyaluminum and tributoxyaluminum), aluminum sulfate, aluminum nitrate and aluminum oxalate, and is used in a desired amount. When the above materials containing aluminum (A) as a third element are produced by the physical mixing method, aluminum oxide or a compound which forms aluminum oxide when fired, specifically, any one of the above compounds used in the solution method, is used in a desired amount.

When the above materials containing antimony (Sb) as a third element are produced by the solution method, the antimony compound is selected from antimony chloride, antimony fluoride, antimony alkoxides (trimethoxyantimony, triethoxyantimony, tripropoxyantimony and tributoxyantimony), antimony sulfate, and antimony hydroxide, and is used in a desired amount. When the above materials containing antimony (Sb) as a third element are produced by the physical mixing method, antimony oxide or a compound which forms antimony oxide when fired, specifically, any one of the above compounds used in the solution method, is used in a desired amount.

When the above materials containing gallium (Ga) as a third element are produced by the solution method, the gallium compound is selected from gallium chloride, gallium alkoxides (trimethoxygallium, triethoxygallium, tripropoxygallium and tributoxygallium) and gallium sulfate, and is used in a desired amount. When the above materials containing gallium (Ga) as a third element are produced by the physical mixing method, gallium oxide or a compound which forms gallium oxide when fired, specifically, any one of the above compounds used in the solution method, is used in a desired amount.

When the above materials containing germanium (Ge) as a third element are produced by the solution method, the germanium compound is selected from germanium chloride and germanium alkoxides (tetramethoxygermanium, tetraethoxygermanium, tetrapropoxygermanium and tetrabutoxygermanium), and is used in a desired amount. When the above materials containing germanium (Ge) as a third element are produced by the physical mixing method, germanium or a compound which forms germanium oxide when fired, specifically, any one of the above compounds used in the solution method, is used in a desired amount.

Of powders obtained in the process of producing the above sputtering target (iii) or the above oxide-containing disk or oxide-containing tablet (iv) (powders obtained by calcining the mixture to prepare a calcination product and milling the calcination product as it is or after it is reduction-treated), both a powder formed from at least one of compounds prepared by incorporating at least one of the above third elements into hexagonal laminar compounds of $In_2O_3$ $(ZnO)_m$ (m=2–20), and a powder formed substantially from at least one of the above compounds, and $In_2O_3$ and/or ZnO come under the electrically conductive material II of the present invention.

The transparent electrically conductive layer II can be formed on a predetermined substrate not only by the above direct sputtering method, but also by a reactive sputtering method. The production of the transparent electrically conductive layer II by the reactive sputtering method can be carried out in the same manner as in the production of the transparent electrically conductive layer I by the reactive sputtering method except for the use of a sputtering target which is formed of an alloy of indium, zinc and at least one of third elements having a valence of at least 3 (e.g., Sn, Al, Sb, Ga and Ge) and in which the atomic ratio of In, In/(In+Zn), and the atomic ratio of the total amount of third elements, (total third elements)/(In+Zn+total third elements), are respectively predetermined values.

The above term "sputtering target in which the atomic ratio of In, In/(In+Zn), is a predetermined value" refers to a target which gives a layer in which the atomic ratio of In, In/(In+Zn), is a desired value in the range of 0.50 to 0.90. Specifically, there is used a target in which the atomic ratio of In, In/(In+Zn), is in the range of 0.45 to 0.9. Further, the term "target in which the atomic ratio of the total amount of third elements, (total third elements)/(In+Zn+total third element), is a predetermined value" refers to a target which gives a layer in which the atomic ratio of the amount of third elements, (total third elements)/(In+Zn+total third elements), is a desired value equal to, or less than, 0.2.

The above alloy target is obtained by dispersing, in a molten indium, a predetermined amount of a powder or chips of zinc and a predetermined amount of a powder of chips of single element (solid) of at least one of third elements having a valence of at least 3 (e.g., a powder or chips of single element (solid) of at least one third element selected from the group consisting of Sn, Al, Sb, Ga and Ge), and then cooling the dispersion. Further, it can be also obtained by melting an alloy of indium and at least one of third elements having a valence of at least 3 (e.g., Sn, Al Sb, Ga and Ge), dispersing a powder or chips of zinc in the molten alloy, and cooling the dispersion.

For the same reason as that described concerning the above sputtering targets (iii) and (iv), the purity of the above alloy target is preferably at least 98%, more preferably at least 99%, further preferably at least 99.9%.

The transparent electrically conductive layer I and transparent electrically conductive layer II of the present invention, which can be produced by the above-explained coating and thermal decomposition method or sputtering method, are transparent electrically conductive layers having practically sufficient electrical conductivity and light transmittance and having excellent resistance to moist heat and etching properties. The transparent electrically conductive layer I and. transparent electrically conductive layer II of the present invention, which have the above properties, are suitable as transparent electrodes in various fields such as a transparent electrode for a liquid crystal display device, a transparent electrode for an electroluminescence device and a transparent electrode for a solar cell, base materials for forming the above transparent electrodes by an etching method, films for the prevention of electrostatic charge or heaters for deicing on window glass.

The electrically conductive transparent film which comes under the electrically conductive transparent substrate of the present invention will be explained hereinafter.

As explained already, the electrically conductive transparent film of the present invention is characterized in that the above transparent electrically conductive layer I or the above transparent electrically conductive layer II is formed on a transparent polymer substrate in the form of a film or a sheet directly or through at least a crosslined resin layer.

The above transparent polymer substrate in the form of a film or a sheet is selected from substrates formed of a polycarbonate resin, a polyarylate resin, a polyester resin, a polyethersulfone-containing resin, an amorphous polyolefin resin, a polystyrene resin and an acrylic resin. The light transmittance thereof is preferably at least 70%. When it is less than 70%, the substrate is unsuitable as a transparent substrate. As a polymer transparent substrate, a substrates having a light transmittance of at least 80% is more preferred, and a substrate having a light transmittance of at least 90% is further preferred. The thickness of the transparent polymer substrate is preferably 15 $\mu$m to 3 mm, more preferably 50 $\mu$m to 1 mm.

The transparent electrically conductive layer formed on the transparent polymer substrate directly or through a crosslinked resin layer may be any one of the transparent electrically conductive layer I and the transparent electrically conductive layer II as described above, while the layer thickness thereof is preferably 3 to 3,000 nm. When it is less than 3 nm, no sufficient electrical conductivity is obtained.

When it exceeds 3,000 nm, the light transmittance may decrease, or the transparent electrically conductive layer may undergo cracking when the electrically conductive transparent layer is handled. The above layer thickness is more preferably 5 to 1,000 nm, further preferably 10 to 800 nm.

When the crosslinked resin layer is placedbetween the transparent polymer substrate and the transparent electrically conductive layer, a layer formed of an epoxy resin, a phenoxyether resin or an acrylic resin is preferred as the crosslinked resin layer. Further, an adhesive layer and a gas barrier layer may be formed between the transparent polymer layer and the crosslinked resin layer. The material for the adhesive layer is selected from epoxy-, acrylurethane- and phenoxyether-containing adhesives. The material for the gas barrier layer is selected from an ethylene-vinyl alcohol copolymer, polyvinyl alcohol, polyacrylonitrile, polyvinylidene chloride and polyvinylidene fluoride.

The transparent electrically conductive layer is formed on one surface of the transparent polymer substrate, and the other surface of the transparent polymer substrate may be provided with a gas barrier layer, a hard coating layer and an anti-reflection layer.

The electrically conductive transparent film of the present invention has practically sufficient electrical conductivity and light transmittance, and the transparent electrically conductive layer constituting the electrically conductive transparent film has excellent resistance to moist heat, so that, even under a high-humidity environment. The electrically conductive transparent film shows a small decrease in electrical conductivity with time or shows stable electrical conductivity. Further, the transparent electrically conductive layer constituting the electrically conductive transparent film is excellent in etching properties. The electrically conductive transparent film of the present invention, which has the above properties, is suitable as a base material for forming transparent electrodes, by an etching method, in various fields such as a transparent electrode for a liquid crystal display device, a transparent electrode for an electroluminescence device and a transparent electrode for a solar cell, or a film for the prevention of electrostatic charge or a heater for deicing on window glass.

The above electrically conductive transparent film can be produced by various methods. When the transparent electrically conductive layer I or the transparent electrically conductive layer II is formed on the transparent polymer substrate in the form of a film directly or through at least the crosslinked resin layer, the use of a sputtering method such as RF or DC magnetron sputtering or reactive sputtering is preferred, in view of the performance and productivity of the transparent electrically conductive layer, or since the production can be carried out while the substrate temperature is maintained at a low temperature. The production of the transparent electrically conductive layer I or the transparent electrically conductive layer II by a sputtering method is as explained already, The electrically conductive transparent glass which is another electrically conductive transparent substrate of the present invention will be explained hereinafter.

As explained already, the electrically conductive transparent glass of the present invention is characterized in that the above transparent electrically conductive layer I or transparent electrically conductive layer II is formed on a transparent glass substrate. However, when atomic ratio of In, In/(In+Zn), in the transparent electrically conductive layer I or transparent electrically conductive layer II formed by the coating and thermal decomposition method exceeds 0.80, the film shows poor electrical conductivity in some cases.

The above transparent glass substrate can be selected from substrates of various transparent glass films or plates such as substrates of soda-line glass, lead glass, borosilicate glass, high silica glass and alkali-free glass. The kind and thickness thereof are properly selected depending upon intended use of the electrically conductive transparent glass.

The transparent electrically conductive layer formed on the transparent glass substrate may be any one of the transparent electrically conductive layer I and the transparent electrically conductive layer II as described above, while the layer thickness thereof is preferably 3 to 3,000 nm. When it is less than 3 nm, no sufficient electrical conductivity is obtained. When it exceeds 3,000 nm, the electrically conductive transparent glass shows decreased light transmittance. The above layer thickness is more preferably 5 to 1,000 nm, further preferably 10 to 800 nm.

The electrically conductive transparent glass of the present invention has practically sufficient electrical conductivity and light transmittance, and the transparent electrically conductive layer constituting the electrically conductive transparent glass has excellent resistance to moist heat, so that, even under a high-humidity environment, the electrically conductive transparent glass shows a small decrease in electrical conductivity with time or shows stable electrical conductivity. Further, the transparent electrically conductive layer constituting the electrically conductive transparent glass is excellent in etching properties. The electrically conductive transparent glass of the present invention, which has the above properties, is suitable as a base material for forming transparent electrodes, by an etching method, in various fields such as a transparent electrode for a liquid crystal display device, a transparent electrode for an electroluminescence device and a transparent electrode for a solar cell, or a film for the prevention of electrostatic charge or a heater for deicing on window glass.

The above electrically conductive transparent glass can be produced by various methods. However, when the transparent electrically conductive layer I or the transparent electrically conductive layer II is formed on the transparent glass substrate, the production by the coating and thermal decomposition method is preferred for producing it at a low cost with easily controlling its composition, and the production by the sputtering method such as RF or DC magnetron sputtering or reactive sputtering is preferred for producing a layer having high performance with high productivity. The production of the transparent electrically conductive layer I or the transparent electrically conductive layer II by the coating and thermal decomposition method or the sputtering method are as already described.

The electrically conductive materials I to II will be explained hereinafter.

As already explained, the electrically conductive material I is characterized in that it is a powder or sintered body formed from an oxide containing indium (In) and zinc (Zn) as main cation elements, that it contains a hexagonal laminar compound of the general formula, $In_2O_3(ZnO)_m$ (m=2–20), and that the atomic ratio of In, In/(In+Zn), is 0.1 0.9.

The above electrically conductive material. I may be formed substantially of at least one of hexagonal laminar compounds of the above general formula; or may be formed substantially of a material containing crystalline or amorphous $In_2O_3$ and/or ZnO in addition to at least one of hexagonal laminar compound of the above general formula.

The electrically conductive material I can be obtained in the step of producing the above sputtering targets (i) and (ii), while the production process thereof is not limited thereto.

As already described, the electrically conductive material II is characterized in that it is a powder or sintered body formed from an oxide containing, as main cation elements, at least one of third elements having a valence of at least 3 (e.g., tin (Sn), aluminum (Al), antimony (Sb), gallium (Ga) and germanium (Ge)) in addition to indium (In) and zinc (Zn), that it contains a compound prepared by incorporating at least one of the above third elements into a hexagonal laminar compound of the general formula, $In_2O_3(ZnO)_m$ (m=2–20), that the atomic ratio of In, In/(In+Zn), is 0.1 to 0.9 and that atomic ratio of the total amount of third elements, (total third elements)/(In+Zn+total third element), is 0.2 or less.

The electrically conductive material II can be obtained in the step of producing the above sputtering targets (i) and (ii), while the production process thereof is not limited thereto.

The above electrically conductive material II may be formed substantially from at least one of the above compounds or may be formed substantially from a material containing crystalline or amorphous $In_2O_3$ and/or ZnO in addition to at least one of the above compounds.

Examples of the present invention will be explained hereinafter.

EXAMPLE 1

Transparent electrically conductive layers I were produced in the following manner, by a coating and thermal decomposition method using indium acetate as an indium compound, anhydrous zinc acetate as a zinc compound, 2-methoxymethanol as a solvent, monoethanolamine as a stabilizer, and a quartz glass plate as a substrate.

First, 4.6 g of monoethanolamine and 3.0 g of indium acetate were added to 21.5 g of 2-methoxyethanol, and the mixture was stirred for 10 minutes to obtain a transparent solution. While this transparent solution was stirred, 0.9 g of anhydrous zinc acetate was added to the transparent solution, and the mixture was stirred for 10 minutes to obtain a transparent homogeneous coating solution. In this coating solution, the atomic ratio of In, In/(In+Zn), was 0.67, and the concentration of the total amount of In and Zn was 0.5 mol/liter (4 mol %).

Then, a quartz glass plate (70×20×1.5 mm) was dipped in the above-obtained coating solution to carry out a dip-coating (coating rate: 1.2 cm/minute), and then, the coating was calcined in an electric oven at 500° C. for 10 minutes. The above procedure of calcination after the dip-coating was repeated up to 10 times as a total, and further, the coating was fired at 500° C. for 1 hour.

Then, the coating was reduced under vacuum ($1 \times 10^{-2}$ torr) at 400° C. for 2 hours to give an intended transparent electrically conductive layer I.

Further, three other transparent electrically conductive layers I were separately obtained in the same manner as above except that the calcining temperature was changed to 300° C., 400° C. or 500° C. and that the firing temperature was changed to 300° C., 400° C. or 600° C. as shown in Table 1.

The so-obtained four transparent electrically conductive layers I were measured by XRD (X-ray diffraction) to show that they were all amorphous oxides of In and Zn. FIG. 1 shows an XRD measurement result of the transparent electrically conductive layer I obtained by the firing at 500° C. Further, the transparent electrically conductive layers I were measured for a composition by X-ray photoelectron spectral analysis (XPS) to show that the atomic ratio of In, In/(In+Zn), in each layer was 0.67. Further, the transparent electrically conductive layers I were measured for a thickness on the basis of their electron microscopic photographs to show 200 nm each.

The above transparent electrically conductive layers I were measured for a surface resistance by a four probe method and for a transmittance to visible light (wavelength 550 nm), and Table 1 shows the results. Further, the above transparent electrically conductive layers I were tested for a resistance to moist heat under conditions of 40° C. and 90% RH, and measured for a surface resistance after a test time of 1,000 hours. Table 1 also shows the results. Further, the transparent electrically conductive layers I were measured for an etching rate by the use of a liquid prepared by diluting an etching solution of which the hydrochloric acid:nitric acid:water amount ratio was 1:0.08:1 (molar ratio), 10 times. Table 1 also shows the results.

COMPARATIVE EXAMPLE 1

A transparent electrically conductive layer (thickness 200 nm) was obtained in the same manner as in Example 1 (calcining temperature 500° C.) except that the firing temperature was changed to 700° C.

The so-obtained transparent electrically conductive layer was measured by XRD to show that it was crystalline. It was also measured for a composition by XPS to show that the atomic ratio of In, In/(In+Zn), was 0.67.

The above electrically conductive layer was also measured for a surface resistance and a transmittance to visible light in the same manner as in Example 1, and it was also tested for resistance to moist heat in the same manner as in Example 1 and measured for a surface resistance after a test time of 1,000 hours. Further, the transparent electrically conductive layer was measured for an etching rate in the same manner as in Example 1. Table 1 shows the results.

EXAMPLE 2

4.45 Grams of monoethanolamine and 2.97 g of indium acetate were added to 21.91 g of 2-methoxyethanol, and the mixture was stirred for 10 minutes to give a transparent solution. While the transparent solution was stirred, 0.67 g of anhydrous zinc acetate was added to the transparent solution, and the mixture was stirred for 10 minutes to give a transparent and homogeneous coating solution. In this coating solution, the atomic ratio of In, In/(In+Zn), was 0.75, and the concentration of the total amount of In and Zn was 0.5 mol/liter (4 mol %).

Thereafter, the procedures described in Example 1 were repeated to give four transparent electrically conductive layers I (thickness 200 nm), the firing temperatures for which were different, i.e., 300° C., 400° C., 500° C. and 600° C., as shown in Table 1.

The so-obtained four transparent electrically conductive layers I were measured by XRD to show they were all amorphous oxides of In and Zn. These transparent electrically conductive layers I were measured for a composition by XPS to show that the atomic ratio of In, In/(In+Zn), in each layer was 0.75.

The above electrically conductive layers I were also measured for a surface resistance and a transmittance to visible light in the same manner as in Example 1, and they were also tested for resistance to moist heat in the same manner as in Example 1 and measured for a surface resistance after a test time of 1,000 hours. Further, the transparent electrically conductive layers I were measured for an etching rate in the same manner as in Example 1. Table 1 shows the results.

COMPARATIVE EXAMPLE 2

A transparent electrically conductive layer (thickness 200 nm) was obtained in the same manner as in Example 2 (calcining temperature 500° C.) except that the firing temperature was changed to 700° C.

The so-obtained transparent electrically conductive layer was measured by XRD to show that it was crystalline. It was also measured for a composition by XPS to show that the atomic ratio of In, In/(In+Zn), was 0.75.

The above electrically conductive layer was also measured for a surface resistance and a transmittance to visible light in the same manner as in Example 1, and it was also tested for resistance to moist heat in the same manner as in Example 1 and measured for a surface resistance after a test time of 1,000 hours. Further, the transparent electrically conductive layer was measured for an etching rate in the same manner as in Example 1. Table 1 shows the results.

EXAMPLE 3

4.93 Grams of monoethanolamine and 2.41 g of indium acetate were added to 21.32 g of 2-methoxyethanol, and the mixture was stirred for 10 minutes to give a transparent solution. While the transparent solution was stirred, 1.34 g of anhydrous zinc acetate was added to the transparent solution, and the mixture was stirred for 10 minutes to give a transparent and homogeneous coating solution. In this coating solution, the atomic ratio of In, In/(In+Zn), was 0.55, and the concentration of the total amount of In and Zn was 0.5 mol/liter (4 mol %).

Thereafter, the procedures described in Example 1 were repeated to give four transparent electrically conductive layers I (thickness 200 nm), the firing temperatures for which were different, i.e., 300° C., 400° C., 500° C. and 600° C., as shown in Table 1.

The so-obtained four transparent electrically conductive layers I were measured by XRD to show they were all amorphous oxides of In and Zn. These transparent electrically conductive layers I were measured for a composition by XPS to show that the atomic ratio of In, In/(In+Zn), in each film was 0.55.

The above electrically conductive layers I were also measured for a surface resistance and a transmittance to visible light in the same manner as in Example 1, and they were also tested for resistance to moist heat in the same manner as in Example 1 and measured for a surface resistance after a test time of 1,000 hours. Further, the transparent electrically conductive layers I were measured for an etching rate in the same manner as in Example 1. Table 1 shows the results.

COMPARATIVE EXAMPLE 3

A transparent electrically conductive layer (thickness 200 nm) was obtained in the same manner as in Example 3 (calcining temperature 500° C.) except that the firing temperature was changed to 700° C.

The so-obtained transparent electrically conductive layer was measured by XRD to show that it was crystalline. It was also measured for a composition by XPS to show that the atomic ratio of In, In/(In+Zn), was 0.55.

The above electrically conductive layer was also measured for a surface resistance and a transmittance to visible light in the same manner as in Example 1, and it was also tested for resistance to moist heat in the same manner as in Example 1 and measured for a surface resistance after a test time of 1,000 hours. Further, the transparent electrically conductive layer was measured for an etching rate in the same manner as in Example 1. Table 1 shows the results.

COMPARATIVE EXAMPLE 4

A transparent and homogeneous coating solution was obtained in the same manner as in Example 1 except that the atomic ratio of In, In/(In+Zn), in the coating solution was changed to 0.50.

Thereafter, a transparent electrically conductive layer (thickness 200 nm) was obtained in the same manner as in Example 1 (calcining temperature 500° C.) except that the firing temperature was changed to 700° C.

The so-obtained transparent electrically conductive layer was measured for a composition by XPS to show that the atomic ratio of In, In/(In+Zn), was 0.50.

The above electrically conductive layer was also measured for a surface resistance and a transmittance to visible light in the same manner as in Example 1, and it was also tested for resistance to moist heat in the same manner as in Example 1 and measured for a surface resistance after a test time of 1,000 hours. Further, the transparent electrically conductive layer was measured for an etching rate in the same manner as in Example 1. Table 1 shows the results.

COMPARATIVE EXAMPLE 5

A transparent and homogeneous coating solution was obtained in the same manner as in Example 1 except that the atomic ratio of In, In/(In+Zn), in the coating solution was changed to 0.33.

Thereafter, the coating, the firing (calcining temperature 500° C., firing temperature 500° C.) and the reduction treatment were carried out in the same manner as in Example 1 to give a transparent electrically conductive layer (thickness 200 nm).

The so-obtained transparent electrically conductive layer was measured for a composition by XPS to show that: the atomic ratio of In, In/(In+Zn), was 0.33.

The above electrically conductive layer was also measured for a surface resistance and a transmittance to visible light in the same manner as in Example 1, and it was also tested for resistance to moist heat in the same manner as in Example 1 and measured for a surface resistance after a test time of 1,000 hours. Further, the transparent electrically conductive layer was measured for an etching rate in the same manner as in Example 1. Table 1 shows the results.

COMPARATIVE EXAMPLE 6

A transparent and homogeneous coating solution was obtained in the same manner as in Example 1 except that the atomic ratio of In, In/(In+Zn), in the coating solution was changed to 0.80.

Thereafter, a transparent electrically conductive layer (thickness 200 nm) was obtained in the same manner as in Comparative Example 4.

The so-obtained transparent electrically conductive layer was measured for a composition by XPS to show that the atomic ratio of In, In/(In+Zn), was 0.80.

The above electrically conductive layer was measured for a surface resistance and a transmittance to visible light in the same manner as in Example 1, and it was also tested for resistance to moist heat in the same manner as in Example 1 and measured for a surface resistance after a test time of 1,000 hours. Further, the transparent electrically conductive layer was measured for an etching rate in the same manner as in Example 1. Table 1 shows the results.

COMPARATIVE EXAMPLE 7

4.0 Grams of monoethanolamine and 3.8 g of indium acetate were added to 22.2 g of 2-methoxymethanol, and the mixture was stirred for 10 minutes to give a transparent and homogeneous coating solution. The concentration of In in the coating solution was 4 mol %.

Thereafter, a thin layer of indium oxide (thickness 200 nm) was obtained in the same manner as in Comparative Example 5.

The so-obtained thin layer of indium oxide was measured for a surface resistance and a transmittance to visible light in the same manner as in Example 1, and it was also tested for resistance to moist heat in the same manner as in Example 1 and measured for a surface resistance after a test time of 1,000 hours. Further, the thin layer of indium oxide was measured for an etching rate in the same manner as in Example 1. Table 1 shows the results.

COMPARATIVE EXAMPLE 8

An ITO thin layer (Sn 4 at %, thickness 200 nm) was obtained in the same manner as in Comparative Example 7 except that 0.16 g of $Sn(OC_4H_9)_2$ was added to the same coating solution as that used in Comparative Example 8.

The so-obtained ITO thin layer was measured for a surface resistance and a transmittance to visible light in the same manner as in Example 1, and it was also tested for resistance to moist heat in the same manner as in Example 1 and measured for a surface resistance after a test time of 1,000 hours. Further, the ITO thin layer was measured for an etching rate in the same manner as in Example 1. Table 1 shows the results.

TABLE 1

| | | Firing (°C.) | | | Transmittance |
|---|---|---|---|---|---|
| | Atomic ratio*1 | Calcination | Firing | Layer properties | to visible light |
| Ex.1 | 0.67 | 300 | 300 | amorphous | 80% |
| | | 400 | 400 | amorphous | 80% |
| | | 500 | 500 | amorphous | 81% |
| | | 500 | 600 | amorphous | 81% |
| CEx.1 | 0.67 | 500 | 700 | crystalline | 80% |
| Ex.2 | 0.75 | 300 | 300 | amorphous | 80% |
| | | 400 | 400 | amorphous | 80% |
| | | 500 | 500 | amorphous | 81% |
| | | 500 | 600 | amorphous | 81% |
| CEx.2 | 0.75 | 500 | 700 | crystalline | 80% |
| Ex.3 | 0.55 | 300 | 300 | amorphous | 80% |
| | | 400 | 400 | amorphous | 80% |
| | | 500 | 500 | amorphous | 81% |
| | | 500 | 600 | amorphous | 81% |
| CEx. 3 | 0.55 | 500 | 700 | crystalline | 80% |
| CEx. 4 | 0.50 | 500 | 700 | crystalline | 80% |
| CEx. 5 | 0.33 | 500 | 500 | amorphous | 80% |
| CEx. 6 | 0.80 | 500 | 700 | crystalline | 81% |
| CEx. 7 | 1.0*2 | 500 | 500 | crystalline | 80% |
| CEx. 8 | ITO*3 | 500 | 500 | crystalline | 80% |

| | Surface resistance ($\Omega/\square$) | | Film thickness | Etching rate |
|---|---|---|---|---|
| | Before test | After test | (nm) | (nm/minute) |
| Ex.1 | 117 | 120 | | 300 |
| | 113 | 118 | 200 | 280 |
| | 140 | 150 | | 260 |
| | 112 | 116 | | 250 |
| CEx.1 | 15,000 | 15,130 | 200 | 99 |
| Ex.2 | 125 | 127 | | 295 |
| | 120 | 123 | 200 | 278 |
| | 115 | 117 | | 259 |
| | 118 | 121 | | 249 |
| CEx.2 | 14,800 | 14,900 | 200 | 95 |

TABLE 1-continued

| Ex.3 | 133 | 134 | | 305 |
|---|---|---|---|---|
| | 131 | 132 | 200 | 285 |
| | 130 | 132 | | 265 |
| | 131 | 133 | | 255 |
| CEx.3 | 14,700 | 14,800 | 200 | 99 |
| CEx.4 | 14,500 | 14,590 | | 99 |
| CEx.5 | 500 | 510 | 200 | 1,000 |
| CEx.6 | 19,000 | 19,500 | | 59 |
| CEx.7 | 630 | 10,900 | 200 | 11 |
| CEx.8 | 170 | 5,400 | 200 | 3 |

Ex. = Example,
CEx. = Comparative Example
*1: showing an atomic ratio of In, In/(In + Zn).
*2: showing a thin layer of indium oxide.
*3: showing an ITO thin layer containing 4 at % of Sn.

As is clearly shown in Table 1, the transparent electrically conductive layers I in Examples 1 to 3, formed of amorphous oxides in which the atomic ratio of In, In/(In+Zn), was 0.55 to 0.75, had electrical conductivity similar to or higher than the ITO layer in Comparative Example 8. Further, each of the transparent electrically conductive layers I in Examples 1 to 3 had excellent transmittance to visible light. Further, the surface resistance of each of the transparent electrically conductive layers I in Examples 1 to 3 showed almost no change between after and before the test on resistance to moist heat. This shows that the transparent electrically conductive layers I in Examples 1 to 3 were excellent in resistance to moist heat. Further, the transparent electrically conductive layers I in Examples 1 to 3 showed high etching rates than the ITO layer in Comparative Example 8, which shows that the transparent electrically conductive layers I in Examples 1 to 3 were excellent in etching properties.

Meanwhile, as is clear in Table 1, the electrically conductive layers in Comparative Examples 1 to 3, in which the atomic ratio of In, In/(In+Zn), was 0.55 to 0.75, but which were formed of crystalline oxides, had very low electrical conductivity. Further, as is clear in Table 1, the transparent electrically conductive layer in Comparative Example 5, in which the atomic ratio, In/(In+Zn), was outside the range defined by the present invention, had poor electrical conductivity as compared with the transparent electrically conductive layers I in Examples where the kinds of starting materials, the firing conditions and reduction conditions were the same. And, it is clear that the thin layer of indium oxide in Comparative Example 7 was inferior to the transparent electrically conductive layers I in Examples 1 to 3 in electrical conductivity and resistance to moist heat, and that the ITO layer in Comparative Example 8 had excellent electrical conductivity and transmittance to visible light, but was inferior to the transparent electrically conductive layers I in Examples 1 to 3 in resistance to moist heat.

EXAMPLE 4

A transparent electrically conductive layer II was produced in the following manner, by a coating and thermal decomposition method using indium acetate as an indium compound, anhydrous zinc acetate as a zinc compound, dibutoxytin as a third element, 2-methoxymethanol as a solvent, monoethanolamine as a stabilizer, and a quartz glass plate as a substrate.

First, 30 grams of a transparent and homogeneous solution (corresponding to the coating solution in Example 1) was prepared from 2-methoxymethanol, monoethanolamine, indium acetate and anhydrous zinc acetate in the same manner as in Example 1.

Then, 0.16 g of dibutoxytin was added to the above solution, and the mixture was stirred for 10 minutes to prepare a transparent and homogeneous coating solution. In this coating solution, the atomic ratio of In, In/(In+Zn) was 0.67, the atomic ratio of Sn, Sn/(In+Zn+Sn), was 0.04, and the concentration of the total amount of In, Zn and Sn was 0.5 mol/liter (4 mol %).

Then, a glass plate (7059: 70×20×1.5 mm, supplied by Corning) was dipped in the above-obtained coating solution under the same conditions as those in Example 1, and the coating was calcined in an electric oven at 500° C. for 10 minutes. The above procedure of calcination after the dip-coating was repeated up to 10 times as a total, and further, the coating was fired at 500° C. for 1 hour.

Then, the coating was reduced under vacuum ($1 \times 10^{-2}$ torr) at 400° C. for 2 hours to give an intended transparent electrically conductive layer II (thickness 200 nm).

The above-obtained transparent electrically conductive layer II was measured by XRD to show it was formed of an amorphous oxide of In, Zn and Sn. Further, the above electrically conductive layer II was also measured for a surface resistance and a transmittance to visible light in the same manner as in Example 1, and it was also tested for resistance to moist heat in the same manner as in Example 1 and measured for a surface resistance after a test time of 1,000 hours. Further, the transparent electrically conductive layer II was measured for an etching rate in the same manner as in Example 1. Table 2 shows the results.

EXAMPLE 5

A coating solution (In/(In+Zn)=0.67, Al/(In+Zn+Al)=0.04, concentration of the total amount of In, Zn and Al=0.5 mol/liter (4 mol %)) was prepared in the same manner as in Example 4 except that dibutoxytin was replaced with 0.15 g of tributoxyaluminum. A transparent electrically conductive layer II (thickness 200 nm) was prepared from the above coating solution in the same manner as in Example 4.

The above-obtained transparent electrically conductive layer II was measured by XRD to show it was formed of an amorphous oxide of In, Zn and Al. Further, the above electrically conductive layer II was also measured for a surface resistance and a transmittance to visible light in the same manner as in Example 1, and it was also tested for resistance to moist heat in the same manner as in Example 1 and measured for a surface resistance after a test time of 1,000 hours. Further, the transparent electrically conductive layer II was measured for an etching rate in the same manner as in Example 1. Table 2 shows the results.

EXAMPLE 6

A coating solution (In/(In+Zn)=0.67, Sb/(In+Zn+Sb)=0.04, concentration of the total amount of In, Zn and Sb=0.5 mol/liter (4 mol %)) was prepared in the same manner as in Example 4 except that dibutoxytin was replaced with 0.21 g of tributoxyantimony. A transparent electrically conductive layer II (thickness 200 nm) was prepared from the above coating solution in the same manner as in Example 4.

The above-obtained transparent electrically conductive layer II was measured by XRD to show it was formed of an amorphous oxide of In, Zn and Sb. Further, the above electrically conductive layer II was also measured for a surface resistance and a transmittance to visible light in the same manner as in Example 1, and it was also tested for resistance to moist heat in the same manner as in Example 1 and measured for a surface resistance after a test time of 1,000 hours. Further, the transparent electrically conductive layer II was measured for an etching rate in the same manner as in Example 1. Table 2 shows the results.

EXAMPLE 7

A coating solution (In/(In+Zn)=0.67, Ga/(In+Zn+Ga)=0.04, concentration of the total amount of In, Zn and Ga=0.5 mol/liter (4 mol %)) was prepared in the same manner as in Example 4 except that dibutoxytin was replaced with 0.11 g of gallium chloride (valence of 3). A transparent electrically conductive layer II (thickness 200 nm) was prepared from the above coating solution in the same manner as in Example 4.

The above-obtained transparent electrically conductive layer II was measured by XRD to show it was formed of an amorphous oxide of In, Zn and Ga. Further, the above electrically conductive layer II was also measured for a surface resistance and a transmittance to visible light in the same manner as in Example 1, and it was also tested for resistance to moist heat in the same manner as in Example 1 and measured for a surface resistance after a test time of 1,000 hours. Further, the transparent electrically conductive layer II was measured for an etching rate in the same manner as in Example 1. Table 2 shows the results.

EXAMPLE 8

A coating solution (In/(In+Zn)=0.67, Ge/(In+Zn+Ge)= 0.04, concentration of the total amount of in, Zn and Ge=0.5 mol/liter (4 mol %)} was prepared in the same manner as in Example 4 except that dibutoxytin was replaced with 0.15 g of tetrapropoxygermanium. A transparent electrically conductive layer II (thickness 200 nm) was prepared from the above coating solution in the same manner as in Example 4.

The above-obtained transparent electrically conductive layer II was measured by XRD to show it was formed of an amorphous oxide of In, Zn and Ge. Further, the above electrically conductive layer II was also measured for a surface resistance and a transmittance to visible light in the same manner as in Example 1, and it was also tested for resistance to moist heat in the same manner as in Example 1 and measured for a surface resistance after a test time of 1,000 hours. Further, the transparent electrically conductive layer II was measured for an etching rate in the same manner as in Example 1. Table 2 shows the results.

TABLE 2

| | Third Element | Atomic ratio of third element*1 | Atomic ratio*2 | Firing (°C.) Calcination | Firing | Layer properties |
|---|---|---|---|---|---|---|
| Ex.4 | Sn(OC$_4$H$_9$)$_2$ | 0.040 | 0.67 | 500 | 500 | amorphous |
| Ex.5 | Al(OC$_4$H$_9$)$_2$ | 0.040 | 0.67 | 500 | 500 | amorphous |
| Ex.6 | Sb(OC$_4$H$_9$)$_2$ | 0.040 | 0.67 | 500 | 500 | amorphous |
| Ex.7 | CaCl$_3$ | 0.040 | 0.67 | 500 | 500 | amorphous |
| Ex.8 | Ge(OC$_3$H$_7$)$_4$ | 0.040 | 0.67 | 500 | 500 | amorphous |

| | Transmittance to visible light | Surface resistance (Ω/□) Before test | After test | Layer thickness (nm) | Etching rate (nm/minute) |
|---|---|---|---|---|---|
| Ex. 4 | 82% | 77 | 80 | 200 | 261 |
| Ex. 5 | 81% | 96 | 100 | 200 | 260 |
| Ex. 6 | 82% | 89 | 93 | 260 | 260 |
| Ex. 7 | 81% | 95 | 99 | 200 | 259 |
| Ex. 8 | 81% | 104 | 107 | 200 | 259 |

Ex. = Example
*1: showing (third element)/(In + Zn + third element).
*2: showing an atomic ratio of In, In/(In + Zn).

As is clear in Table 2, the transparent electrically conductive layers II in Examples 4 to 8, formed of an amorphous oxide of In, Zn and a third element (Sn, Al, Sb, Ga or Ge), had higher electrical conductivity than the transparent electrically conductive layers I in Examples 1 to 3, which contained no third element. Further, the transparent electrically conductive layers II in Examples 4 to 8 had excellent transmittance to visible light. Moreover, the surface resistance of each of the transparent electrically conductive layers II in Examples 4 to 8 showed almost no change between after and before the test on resistance to moist heat. This shows that the transparent electrically conductive layers II in Examples 4 to 8 were excellent in resistance to moist heat. Further, the etching rates of the transparent electrically conductive layers II in Examples 4 to 8 are higher than the etching rate of the ITO layer in Comparative Example 8 shown in Table 1, which shows that the transparent electrically conductive layers II in Examples 4 to 8 were excellent in etching properties.

EXAMPLE 9

A biaxially oriented polyester film having a thickness of 125 μm was used as a transparent polymer substrate and a sintered body formed of a mixture of indium oxide and zinc oxide in which the atomic ratio of In, In/(In+Zn), was 0.67 was used as a sputtering target for producing an electrically conductive transparent film in the following manner.

First, the transparent polymer substrate was set in a DC magnetron direct sputtering apparatus, and the pressure in a vacuum chamber was reduced to $1 \times 10^{-5}$ Torr. Then, a gas mixture of argon gas (purity 99.99%) and oxygen gas (purity 99.99%) (Ar:O$_2$=1,000:2.8 (volume ratio)) was introduced up to a vacuum pressure of $2 \times 10^{-3}$ Torr. The voltage to be applied to the target was set at 420 V, the substrate temperature was set at 60° C., and a transparent electrically conductive layer I having a thickness of 250 nm was formed on the transparent polymer substrate by DC magnetron direct sputtering. The transparent electrically conductive layer I was measured for a thickness by a probe method using DEKTAK 3030 supplied by Sloan (The same measurement was carried out in Examples and Comparative Examples to be described below).

The so-obtained electrically conductive transparent film was analyzed for an atomic ratio of In, In/(In+Zn), in the transparent electrically conductive layer I by ICP analysis (Inductively Coupled Plasma Emission Spectrochemical Analysis; using SPS-15OOVR supplied by Seiko Instruments Inc., the same measurement was carried out in Examples and Comparative Examples to be described below). As a result, it was shown that the atomic ratio of In, In/(In+Zn), was the same as that of the sputtering target, or 0.67. Further, the above transparent electrically conductive layer I was analyzed for crystallizability by X-ray diffraction measurement (using Rotor Flex Ru-2000B, supplied by Rigaku k.k., the same measurement was carried out in Examples and Comparative Examples to be described below) to show that it was amorphous. The result of the X-ray diffraction measurement was substantially the same as that shown in FIG. 1.

Further, the above electrically conductive transparent film was measured for a light transmittance by UV light measurement (using U-3210 supplied by Hitachi, Ltd., wavelength of test light=550 nm), and the transparent electrically conductive layer I was measured for a surface resistance by a four-probe method (using Roresta FP supplied by Mitsubishi Petrochemical Co., Ltd.). Further, there was tested a resistance to moist heat under conditions of 40° C. and 90% RH, and the surface resistance and the light transmittance after a test time of 1,000 hours were measured in the same manner as above. Further, the above electrically conductive transparent film was immersed in a liquid prepared by diluting an etching solution of which the hydrochloric acid:nitric acid:water amount ratio was 1:0.08:1 (molar ratio), with water 10 times, and a period of time was measured until the resistance value thereof become at least 2 MΩ. The etching rate of the transparent electrically conductive layer I was calculated on the basis of the period of time. Table 3 shows the results.

EXAMPLE 10

A biaxially oriented polyester film having a thickness of 125 μm was used as a transparent polymer substrate and a sputtering target formed of a mixture of indium and zinc in which the atomic ratio of In, In/(In+Zn), was 0.67 was used as such for producing an electrically conductive transparent film in the following manner.

First, the transparent polymer substrate was set in a sputtering apparatus, and the pressure in a vacuum chamber was reduced to $1 \times 10^{-5}$ Torr. Then, a gas mixture of argon gas (purity 99.99%) and oxygen gas (purity 99.99%) (Ar:$O_2$=1,000:2.8 (volume ratio)) was introduced up to a vacuum pressure of $2 \times 10^{-3}$ Torr. The voltage to be applied to the target was set at 420 V, the substrate temperature was set at 140° C., and a transparent electrically conductive layer I having a thickness of 280 nm was formed on the transparent polymer substrate by reactive sputtering.

In the so-obtained electrically conductive transparent film, the transparent electrically conductive layer I was formed of a composition of indium oxide and zinc oxide, and. the atomic ratio of In, In/(In+Zn), in the transparent electrically conductive layer I was analyzed by ICP to show 0.67. Further, the transparent electrically conductive layer I was analyzed for crystallizability by X-ray diffraction to show that it was amorphous.

Further, the above electrically conductive transparent film was measured for a light transmittance, and the above transparent electrically conductive layer I was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer I was measured for an etching rate in the same manner as in Example 9. Table 3 shows the results.

EXAMPLE 11

A biaxially oriented polyester film having a thickness of 125 μm was used as a transparent polymer substrate and a sputtering target formed of a mixture containing indium, zinc and Sn in which the atomic ratio of In, In/(In+Zn), was 0.67 and the atomic ratio of Sn as a third element, Sn/(In+Zn+Sn), was 0.04 was used as such for producing an electrically conductive transparent film in the following manner.

First, the transparent polymer substrate was set in a sputtering apparatus, and the pressure in a vacuum chamber was reduced to $1 \times 10^{-5}$ Torr. Then, a gas mixture of argon gas (purity 99.99%) and oxygen gas (purity 99.99%) (Ar:$O_2$=1,000:2.8 (volume ratio)) was introduced up to a vacuum pressure of $3 \times 10^{-3}$ Torr. The voltage to be applied to the target was set at 350 V, the substrate temperature was set at 80° C., and a transparent electrically conductive layer II having a thickness of 300 nm was formed on the transparent polymer substrate by sputtering.

In the so-obtained electrically conductive transparent film, the transparent electrically conductive layer II was measured for a composition by ICP to show that the atomic ratio of In, In/(In+Zn), was 0.67 and the atomic ratio of Sn as a third element, Sn/(In+Zn+Sn), was 0.04. Further, the transparent electrically conductive layer II was analyzed for crystallizability by X-ray diffraction to show that it was amorphous.

Further, the above electrically conductive transparent film was measured for a light transmittance, and the above transparent electrically conductive layer I was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer II was measured for an etching rate in the same manner as in Example 9. Table 3 shows the results.

EXAMPLE 12

A biaxially oriented polyester film having a thickness of 125 μm was used as a transparent polymer substrate and a target of a sintered body formed of a hexagonal laminar compound of $In_2O_3(ZnO)_4$, and indium oxide ($In_2O_3$) (atomic ratio of In, In/(In+Zn),=0.67) was used as a sputtering target for producing an electrically conductive transparent layer in the following manner.

First, the transparent polymer substrate was set in an RF magnetron direct sputtering apparatus, and the pressure in a vacuum chamber was reduced to $5 \times 10^{-5}$ Torr. Then, a gas mixture of argon gas (purity 99.99%) and oxygen gas (purity 99.99%) (Ar:$O_2$=1,000:2.8 (volume ratio)) was introduced up to a vacuum pressure of $3 \times 10^{-1}$ Pa. The sputtering output was, set at 100 W, the substrate temperature was set at 20° C., and a transparent electrically conductive layer I having a thickness of 200 nm was formed on the transparent polymer substrate by RF magnetron direct sputtering.

In the so-obtained electrically conductive transparent film, the transparent electrically conductive layer I was measured for a composition by ICP to show that the atomic ratio of In, In/(In+Zn), was 0.70. Further, the electrically conductive layer I was analyzed for crystallizability by X-ray diffraction to show that it was amorphous.

Further, the above electrically conductive transparent film was measured for a light transmittance, and the above transparent electrically conductive layer I was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer I was measured for an etching rate in the same manner as in Example 9. Table 3 shows the results.

EXAMPLE 13

A transparent electrically conductive layer I having a thickness of 200 nm was formed on a transparent polymer substrate in the same manner as in Example 12 except that the sputtering target was replaced with a target of a sintered body formed of a hexagonal laminar compound of $In_2O_3(ZnO)_4$, and indium oxide ($In_2O_3$) in which the atomic ratio of In, In/(In+Zn), was 0.70.

In the so-obtained electrically conductive transparent film, the transparent electrically conductive layer I was measured for a composition by ICP to show that the atomic ratio of In, In/(In+Zn), was 0.74. Further, the transparent electrically conductive layer I was analyzed for crystallizability by X-ray diffraction to show that it was amorphous.

Further, the above electrically conductive transparent film was measured for a light transmittance, and the above transparent electrically conductive layer I was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer I was measured for an etching rate in the same manner as in Example 9. Table 3 shows the results.

EXAMPLE 14

A transparent electrically conductive layer I having a thickness of 200 nm was formed on a transparent polymer substrate in the same manner as in Example 13 except that the RF magnetron direct sputtering apparatus was replaced with a DC magnetron direct sputtering apparatus.

In the so-obtained electrically conductive transparent film, the transparent electrically conductive layer I was measured for a composition by ICP to show that the atomic ratio of In, In/(In+Zn), was 0.73. Further, the transparent electrically conductive layer I was analyzed for crystallizability by X-ray diffraction to show that it was amorphous.

Further, the above electrically conductive transparent film was measured for a light transmittance, and the above transparent electrically conductive layer I was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer I was measured for an etching rate in the same manner as in Example 9. Table 3 shows the results.

EXAMPLE 15

A transparent electrically conductive layer I having a thickness of 180 nm was formed on a transparent polymer substrate in the same manner as in Example 12 except that the sputtering target was replaced with a target of a sintered body formed of a hexagonal laminar compound of $In_2O_3(ZnO)_4$, and indium oxide ($In_2O_3$) in which the atomic ratio of In, In/(In+Zn), was 0.75.

In the so-obtained electrically conductive transparent film, the transparent electrically conductive layer I was measured for a composition by ICP to show that the atomic ratio of In, In/(In+Zn), was 0.79. Further, the transparent electrically conductive layer I was analyzed for crystallizability by X-ray diffraction to show that it was amorphous.

Further, the above electrically conductive transparent film was measured for a light transmittance, and the above transparent electrically conductive layer I was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer I was measured for an etching rate in the same manner as in Example 9. Table 3 shows the results.

EXAMPLE 16

A transparent electrically conductive layer I having a thickness of 200 nm was formed on a transparent polymer substrate in the same manner as in Example 15 except that the substrate temperature in forming the film was set at 80° C.

In the so-obtained electrically conductive transparent film, the transparent electrically conductive layer I was measured for a composition by ICP to show that the atomic ratio of In, In/(In+Zn), was 0.78. Further, the transparent electrically conductive film I was analyzed for crystallizability by X-ray diffraction to show that it was amorphous.

Further, the above electrically conductive transparent film was measured for a light transmittance, and the above transparent electrically conductive layer I was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer I was measured for an etching rate in the same manner as in Example 9. Table 3 shows the results.

EXAMPLE 17

A transparent electrically conductive layer I having a thickness of 220 nm was formed on a transparent polymer substrate in the same manner as in Example 14 except that the sputtering target was replaced with a target of a sintered boded formed of a hexagonal laminar compound of $In_2O_3(ZnO)_4$, and indium oxide ($In_2O_3$) in which the atomic ratio of In, In/(In+Zn), was 0.75.

In the so-obtained electrically conductive transparent film, the transparent electrically conductive layer I was measured for a composition by ICP to show that the atomic ratio of In, In/(In+Zn), was 0.79. Further, the transparent electrically conductive layer I was analyzed for crystallizability by X-ray diffraction to show that it was amorphous.

Further, the above electrically conductive transparent film was measured for a light transmittance, and the above transparent electrically conductive layer I was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer I was measured for an etching rate in the same manner as in Example 9. Table 3 shows the results.

EXAMPLE 18

A transparent electrically conductive layer II having a thickness of 200 nm was formed on a transparent polymer substrate in the same manner as in Example 12 except that the sputtering target was replaced with a target of a sintered body formed of a compound prepared by incorporating tin oxide into a hexagonal laminar compound of $In_2O_3(ZnO)_4$ in which the atomic ratio of In, In/(In+Zn), was 0.75 and the atomic ratio of Sn as a third element, Sn/(In+Zn+Sn) was 0.04.

In the so-obtained electrically conductive transparent film, the transparent electrically conductive layer II was formed of a composition formed by incorporating an oxide of Sn into a composition of indium oxide and zinc oxide, and it was analyzed by ICP to show that the atomic ratio of In, In/(In+Zn), was 0.78 and that the atomic ratio of Sn, Sn/(In+Zn+Sn) was 0.04. Further, the transparent electrically conductive layer II was analyzed for crystallizability by X-ray diffraction to show that it was amorphous.

Further, the above electrically conductive transparent film was measured for a light transmittance, and the above transparent electrically conductive layer II was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer II was measured for an etching rate in the same manner as in Example 9. Table 3 shows the results.

COMPARATIVE EXAMPLE 9

A transparent electrically conductive layer having a thickness of 300 nm was formed on a transparent polymer substrate in the same manner as in Example 9 except that the sputtering target was replaced with a sputtering target of a sintered body formed of a compound (ITO) of indium oxide and tin oxide in which the atomic ratio of In to Sn, In/Sn, was 9/1 and that the substrate temperature in forming the film was set at 80° C.

In the so-obtained electrically conductive transparent film, the transparent electrically conductive layer was analyzed for crystallizability by X-ray diffraction to show a sharp peak of $In_2O_3$.

The above electrically conductive transparent film was measured for a light transmittance, and the above transparent electrically conductive layer was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 3 shows the results.

COMPARATIVE EXAMPLE 10

A transparent electrically conductive film having a thickness of 200 nm was formed on a transparent polymer substrate in the same manner as in Example 12 except that the sputtering target was replaced with a sputtering target of a sintered body formed of a compound (ITO) of indium oxide and tin oxide in which the atomic ratio of In to Sn, In/Sn, was 9/1.

In the so-obtained electrically conductive transparent film, the transparent electrically conductive layer was analyzed for crystallizability by X-ray diffraction to show a slight peak of $In_2O_3$.

The above electrically conductive transparent film was measured for a light transmittance, and the above transparent electrically conductive layer was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive film was measured for an etching rate in the same manner as in Example 9. Table 3 shows the results.

COMPARATIVE EXAMPLE 11

A transparent electrically conductive layer having a thickness of 200 nm was formed on a transparent polymer substrate in the same manner as in Example 12 except that the sputtering target was replaced with a target of indium oxide containing zinc oxide (sintered body in which atomic ratio of In, In/(In+Zn), was 0.90).

In the so-obtained electrically conductive transparent film, the transparent electrically conductive layer was measured for a composition by ICP to show that the atomic ratio of In, In/(In+Zn), was 0.93. Further, the transparent electrically conductive layer was analyzed for crystallizability by X-ray diffraction to show that it was amorphous.

The above electrically conductive transparent film was measured for a light transmittance, and the above transparent electrically conductive layer was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 3 shows the results.

COMPARATIVE EXAMPLE 12

A transparent electrically conductive layer having a thickness of 200 nm was formed on a transparent polymer substrate in the same manner as in Example 12 except that the sputtering target was replaced with a target of indium oxide containing zinc oxide (sintered body in which atomic ratio of In, In/(In+Zn), was 0.93).

In the so-obtained electrically conductive transparent film, the transparent electrically conductive layer was measured for a composition by ICP to show that the atomic ratio of In, In/(In+Zn), was 0.97. Further, the transparent electrically conductive layer was analyzed for crystallizability by X-ray diffraction to show that it was amorphous.

The above electrically conductive transparent film was measured for a light transmittance, and the above transparent electrically conductive layer was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 3 shows the results.

COMPARATIVE EXAMPLE 13

A transparent electrically conductive layer having a thickness of 200 nm was formed on a transparent polymer substrate in the same manner as in Example 16 except that the sputtering target was replaced with a target of indium oxide containing zinc oxide (sintered body in which atomic ratio of In, In/(In+Zn), was 0.93).

In the so-obtained electrically conductive transparent film, the transparent electrically conductive layer was measured for a composition by ICP to show that the atomic ratio of In, In/(In+Zn), was 0.97. Further, the transparent electrically conductive layer was analyzed for crystallizability by X-ray diffraction to show a slight peak of $In_2O_3$.

The above electrically conductive transparent film was measured for a light transmittance, and the above transparent electrically conductive layer was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 3 shows the results.

COMPARATIVE EXAMPLE 14

A transparent electrically conductive layer having a thickness of 200 nm was formed on a transparent polymer substrate in the same manner as in Example 12 except that the sputtering target was replaced with a target prepared by arranging three indium oxide tablets (diameter 10 mm, thickness 5 mm) on a zinc oxide disk having a diameter of 4 inches.

In the so-obtained electrically conductive transparent film, the transparent electrically conductive layer was measured for a composition by ICP to show that the atomic ratio of In, In/(In+Zn), was 0.12. Further, the transparent electrically conductive layer was analyzed for crystallizability by X-ray diffraction to show that it was amorphous.

The above electrically conductive transparent film was measured for a light transmittance, and the above transparent electrically conductive layer was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 3 shows the results.

EXAMPLE 19

An epoxy resin (epoxy acrylate) layer having a thickness of 1 μm was formed on a transparent polymer substrate by a spin coating method, and the epoxy resin was crosslinked by exposing it to UV to form a crosslinked resin layer. Thereafter, a transparent electrically conductive layer I having a thickness of 200 nm was formed on the above crosslinked resin layer in the same manner as in Example 12.

In the so-obtained electrically conductive transparent film, the transparent electrically conductive layer was measured for a composition by ICP to show that the atomic ratio of In, In/(In+Zn), was 0.70. Further, the transparent electrically conductive layer was analyzed for crystallizability by X-ray diffraction to show that it was amorphous.

The above electrically conductive transparent film was measured for a light transmittance, and the above transparent electrically conductive layer was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 3 shows the results.

TABLE 3

| | Transparent electrically conductive layer | | | Transmittance to light | |
|---|---|---|---|---|---|
| | Atomic ratio of In | Third element *1 | Crystal system | Before test | After test |
| Ex.9 | 0.67 | — | amorphous | 82.1 | 81.6 |
| Ex.10 | 0.67 | — | amorphous | 81.2 | 81.1 |
| Ex.11 | 0.67 | Sn(0.04) | amorphous | 83.0 | 82.6 |
| Ex.12 | 0.70 | — | amorphous | 83.5 | 83.2 |
| Ex.13 | 0.74 | — | amorphous | 83.2 | 83.0 |
| Ex.14 | 0.73 | — | amorphous | 82.6 | 82.3 |
| Ex.15 | 0.79 | — | amorphous | 83.6 | 83.3 |
| Ex.16 | 0.78 | — | amorphous | 81.9 | 81.7 |
| Ex.17 | 0.79 | — | amorphous | 82.2 | 81.9 |
| Ex.18 | 0.78 | Sn(0.04) | amorphous | 82.0 | 81.8 |
| Ex.19 | 0.70 | — | amorphous | 83.4 | 83.2 |
| CEx.9 | (ITO) | — | crystalline | 82.2 | 81.5 |
| CEx.10 | (ITO) | — | crystalline | 82.6 | 81.5 |
| CEx.11 | 0.93 | — | amorphous | 83.7 | 83.1 |
| CEx.12 | 0.97 | — | amorphous | 83.2 | 82.5 |
| CEx.13 | 0.97 | — | crystalline | 81.8 | 80.2 |
| CEx.14 | 0.12 | — | amorphous | 81.2 | 81.1 |

| | Surface resistance (Ω/□) | | Specific resistance*2 | | Layer thickness (nm) | Etching rate (nm/minute) |
|---|---|---|---|---|---|---|
| | Before test | After test | Before test | After test | | |
| Ex.9 | 13.1 | 14.0 | 3.3 | 3.5 | 250 | 360 |
| Ex.10 | 12.0 | 13.0 | 3.4 | 3.6 | 280 | 355 |
| Ex.11 | 6.0 | 7.0 | 1.8 | 2.1 | 300 | 358 |
| Ex.12 | 21.0 | 22.5 | 4.2 | 4.5 | 200 | 380 |
| Ex.13 | 20.0 | 21.5 | 4.0 | 4.3 | 200 | 375 |
| Ex.14 | 16.2 | 17.5 | 3.2 | 3.5 | 200 | 370 |
| Ex.15 | 21.5 | 23.0 | 3.9 | 4.1 | 180 | 360 |
| Ex.16 | 19.2 | 20.5 | 3.8 | 4.1 | 200 | 358 |
| Ex.17 | 14.7 | 15.8 | 3.2 | 3.5 | 220 | 355 |
| Ex.18 | 18.5 | 20.0 | 3.7 | 4.0 | 200 | 360 |
| Ex.19 | 21.1 | 22.5 | 4.2 | 4.5 | 200 | 378 |
| CEx.9 | 18.0 | 54.0 | 5.4 | 16 | 300 | 72 |
| CEx.10 | 28.0 | 56.2 | 5.6 | 11 | 200 | 96 |
| CEx.11 | 28.5 | 29.0 | 5.7 | 5.8 | 200 | 145 |
| CEx.12 | 27.0 | 28.5 | 5.4 | 5.7 | 200 | 125 |
| CEx.13 | 210 | 380 | 42 | 76 | 200 | 98 |
| CEx.14 | 315 | 360 | 63 | 72 | 200 | 350 |

Ex. = Example, CEx. = Comparative Example
*1: parenthesized figure shows an atomic ratio of third element, (third element)/(In + Zn + third element)
*2: Unit = × $10^{-4}$ Ωcm As is clear in Table 3, the electrically conductive transparent films obtained in Examples 9 to 18 had practically sufficient electrical conductivity and light transmittance. The surface resistance (specific resistance) of each electrically conductive transparent film tested on resistance to moist heat showed only a small change from the surface resistance which each showed before the test on resistance to moist heat, so that it is seen that each electrically conductive transparent film was excellent in resistance to moist heat. Further, the transparent electrically conductive layers (transparent electrically conductive layers I or II) constituting the electrically conductive transparent films obtained in Examples 9 to 18 had high etching rates, so that it is seen that the transparent electrically conductive layers were excellent in etching properties.

On the other hand, the electrically conductive transparent film of Comparative Example 9 in which a crystalline ITO layer was formed as a transparent electrically conductive layer had practically sufficient electrical conductivity and light transmittance, while the surface resistance after the test on resistance to moist heat showed a great change from the surface resistance before the test. It is therefore seen that the electrically conductive transparent film of Comparative Example 9 was poor in resistance to moist heat. Further, the transparent electrically conductive layer (ITO layer) constituting the electrically conductive transparent film showed a low etching rate. This is also true of the electrically conductive transparent film of Comparative Example 10 in which a crystalline ITO layer was formed as a transparent electrically conductive layer. Further, those in Comparative Examples 11 and 12 had excellent resistance to moist heat, while they were inferior to those in Examples 9 to 18 in electrical conductivity and etching properties (etching rate). And, those in Comparative Examples 13 and 14 had low electrical conductivity.

EXAMPLE 20

An alkali-free glass sheet having a thickness of 125 μm was used as a transparent glass substrate and a sintered body formed of a composition containing indium oxide and zinc oxide in which the atomic ratio of In, In/(In+Zn) was 0.67 was used as a sputtering target for producing an electrically conductive transparent glass in the following manner.

First, the transparent glass substrate was set in a DC magnetron direct sputtering apparatus, and the pressure in a vacuum chamber was reduced to $1\times10^{-5}$ Torr. Then, a gas mixture of argon gas (purity 99.99%) and oxygen gas (purity 99.99%) (Ar:$O_2$=1,000:2.8 (volume ratio)) was introduced up to a vacuum pressure of $2\times10^{-3}$ Torr. The voltage to be applied to the target was set at 420 V, the substrate temperature was set at 240° C., and a transparent electrically conductive layer I having a thickness of 310 nm was formed on the transparent glass substrate by DC magnetron direct sputtering.

In the so-obtained electrically conductive transparent glass, the transparent electrically conductive layer I was measured for a composition by ICP to show that the atomic ratio of In, In/(In+Zn) was the same as that of the sputtering target, or 0.67. Further, the transparent electrically conductive layer I was analyzed for crystallizability by X-ray diffraction to show that it was amorphous. The result of the X-ray diffraction measurement was substantially the same as that shown in FIG. 1.

Further, the above electrically conductive transparent glass was measured for a light transmittance, and the above transparent electrically conductive layer I was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer I was measured for an etching rate in the same manner as in Example 9. Table 4 shows the results.

EXAMPLE 21

An alkali-free glass sheet having a thickness of 125 μm was used as a transparent glass substrate and a target formed of an alloy of indium and zinc in which the atomic ratio of In, In/(In+Zn) was 0.67 was used as a sputtering target for producing an electrically conductive transparent glass in the following manner.

First, the transparent glass substrate was set in a sputtering apparatus, and the pressure in a vacuum chamber was reduced to $1\times10^{-5}$ Torr. Then, a gas mixture of argon gas (purity 99.99%) and oxygen gas (purity 99.99%) (Ar:$O_2$=1,000:2.8 (volume ratio)) was introduced up to a vacuum pressure of $2\times10^{-3}$ Torr. The voltage to be applied to the target was set at 420 V, the substrate temperature was set at 240° C., and a transparent electrically conductive layer I having a thickness of 280 nm was formed on the transparent glass substrate by reactive sputtering.

In the so-obtained electrically conductive transparent glass, the transparent electrically conductive layer I was formed of a composition containing indium oxide and zinc oxide, and it was analyzed by ICP to show that the atomic ratio of In, In/(In+Zn) was 0.67. Further, the transparent electrically conductive layer I was analyzed for crystallizability by X-ray diffraction to show that it was amorphous.

Further, the above electrically conductive transparent glass was measured for a light transmittance, and the above transparent electrically conductive layer I was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer I was measured for an etching rate in the same manner as in Example 9. Table 4 shows the results.

EXAMPLE 22

An alkali-free glass sheet having a thickness of 125 μm was used as a transparent glass substrate, and a sintered body formed of a composition prepared by incorporating tin oxide into a composition containing indium and zinc in which the atomic ratio of In, In/(In+Zn) was 0.67 and the atomic ratio of Sn as a third element, Sn/(In+Zn+Sn) was 0.04, was used as a sputtering target for producing an electrically conductive transparent glass in the following manner.

First, the transparent glass substrate was set in a DC magnetron direct sputtering apparatus, and the pressure in a vacuum chamber was reduced to $1\times10^{-5}$ Torr. Then, a gas mixture of argon gas (purity 99.99%) and oxygen gas (purity 99.99%) (Ar:$O_2$=1,000:2.8 (volume ratio)) was introduced up to a vacuum pressure of $3\times10^{-3}$ Torr. The voltage to be applied to the target was set at 350 V, the substrate temperature was set at 210° C., and a transparent electrically conductive layer II having a thickness of 300 nm was formed on the transparent glass substrate by DC magnetron direct sputtering.

In the so-obtained electrically conductive transparent film, the transparent electrically conductive layer II was formed of a composition obtained by incorporating an oxide of Sn into the composition containing indium oxide and zinc oxide, and it was analyzed by ICP to show that the atomic ratio of In, In/(In+Zn) was 0.67 and that the atomic ratio of Sn as a third element, Sn/(In+Zn+Sn) was 0.04. Further, the transparent electrically conductive layer II was analyzed for crystallizability by X-ray diffraction to show that it was amorphous.

Further, the above electrically conductive transparent film was measured for a light transmittance, and the above transparent electrically conductive layer II was measured for a surface resistance, in the same manner as in Example 9. Further, the electrically conductive transparent film was tested for a resistance to moist heat in the same manner as in Example 9. Then, the surface resistance and the light transmittance after a test time of 1,000 hours were measured in the same manner as in Example 9. Further, the transparent electrically conductive layer II was measured for an etching rate in the same manner as in Example 9. Table 4 shows the results.

EXAMPLE 23

An alkali-free glass sheet having a thickness of 125 μm was used as a transparent glass substrate, and a target of a sintered body formed of a hexagonal laminar compound of $In_2O_3(ZnO)_4$, and indium oxide ($In_2O_3$) (atomic ratio of In, In/(In+Zn),=0.67) was used as a sputtering target for producing an electrically conductive transparent glass in the following manner.

First, the transparent glass substrate was set in an RF magnetron direct sputtering apparatus, and the pressure in a vacuum chamber was reduced to $5\times10^{-5}$ Torr. Then, a gas mixture of argon gas (purity 99.99%) and oxygen gas (purity 99.99%) ($Ar:O_2$=1,000:2.8 (volume ratio)) was introduced up to a vacuum pressure of $3\times10^{-1}$ Pa. The sputtering output was set at 100 W, the substrate temperature was set at 20° C., and a transparent electrically conductive film I having a thickness of 200 nm was formed on the transparent glass substrate by RF magnetron direct sputtering.

In the so-obtained electrically conductive transparent glass, the transparent electrically conductive layer I was measured for a composition by ICP to show that the atomic ratio of In, In/(In+Zn), was 0.70. Further, the transparent electrically conductive layer I was analyzed for crystallizability by X-ray diffraction to show that it was amorphous.

Further, the above electrically conductive transparent glass was measured for a light transmittance, and the above transparent electrically conductive layer I was measured for a surface resistance, in the same manner as in Example 9. Further, the electrically conductive transparent glass was tested for a resistance to moist heat in the same manner as in Example 9. Then, the surface resistance and the light transmittance after a test time of 1,000 hours were measured in the same manner as in Example 9. Further, the transparent electrically conductive layer I was measured for an etching rate in the same manner as in Example 9. Table 4 shows the results.

EXAMPLE 24

A transparent electrically conductive layer I having a thickness of 200 nm was formed on a transparent glass substrate in the same manner as in Example 22 except that the sputtering target was replaced with a target of a sintered body formed of a hexagonal laminar compound of $In_2O_3$ $(ZnO)_4$, and indium oxide ($In_2O_3$) in which the atomic ratio of In, In/(In+Zn), was 0.70.

In the so-obtained electrically conductive transparent glass, the transparent electrically conductive layer I was measured for a composition by ICP to show that the atomic ratio of In, In/(In+Zn), was 0.74. Further, the transparent electrically conductive layer I was analyzed for crystallizability by X-ray diffraction to show that it was amorphous.

Further, the above electrically conductive transparent glass was measured for a light transmittance, and the above transparent electrically conductive layer I was measured for a surface resistance, in the same manner as in Example 9. Further, the electrically conductive transparent glass was tested for a resistance to moist heat in the same manner as in Example 9. Then, the surface resistance and the light transmittance after a test time of 1,000 hours were measured in the same manner as in Example 9. Further, the transparent electrically conductive layer I was measured for an etching rate in the same manner as in Example 9. Table 4 shows the results.

EXAMPLE 25

A transparent electrically conductive layer I having a thickness of 250 nm was formed on a transparent glass substrate in the same manner as in Example 24 except that the substrate temperature in forming the film was set at 200° C.

In the so-obtained electrically conductive transparent glass, the transparent electrically conductive layer I was measured for a composition by ICP to show that the atomic ratio of In, In/(In+Zn), was 0.73. Further, the transparent electrically conductive layer I was analyzed for crystallizability by X-ray diffraction to show that it was amorphous.

Further, the above electrically conductive transparent glass was measured for a light transmittance, and the above transparent electrically conductive layer I was measured for a surface resistance, in the same manner as in Example 9. Further, the electrically conductive transparent glass was tested for a resistance to moist heat in the same manner as in Example 9. Then, the surface resistance and the light transmittance after a test time of 1,000 hours were measured in the same! manner as in Example 9. Further, the transparent electrically conductive layer I was measured for an etching rate in the same manner as in Example 9. Table 4 shows the results.

EXAMPLE 26

A transparent electrically conductive layer I having a thickness of 250 nm was formed on a transparent glass substrate in the same manner as in Example 24 except that the RF magnetron direct sputtering apparatus was replaced with a D(C magnetron direct sputtering apparatus.

In the so-obtained electrically conductive transparent glass, the transparent electrically conductive layer I was measured for a composition by ICP to show that the atomic ratio of In, In/(In+Zn), was 0.73. Further, the transparent electrically conductive layer I was analyzed for crystallizability by X-ray diffraction to show that it was amorphous.

Further, the above electrically conductive transparent glass was measured for a light transmittance, and the above transparent electrically conductive layer I was measured for a surface resistance, in the same manner as in Example 9. Further, the electrically conductive transparent glass was tested for a resistance to moist heat in the same manner as in. Example 9. Then, the surface resistance and the light transmittance after a test time of 1,000 hours were measured in the same manner as in Example 9. Further, the transparent electrically conductive layer I was measured for an etching rate in the same manner as in Example 9. Table 4 shows the results.

EXAMPLE 27

A transparent electrically conductive layer I having a thickness of 200 nm was formed on a transparent glass substrate in the same manner as in Example 23 except that the sputtering target was replaced with a target prepared by arranging five zinc oxide tablets (diameter 10 mm, thickness 5 mm) on an indium oxide disk having a diameter of 4 inches.

In the so-obtained electrically conductive transparent glass, the transparent electrically conductive layer I was measured for a composition by ICP to show that the atomic ratio of In, In/(In+Zn), was 0.72. Further, the transparent electrically conductive layer was analyzed for crystallizability by X-ray diffraction to show that it was amorphous.

Further, the above electrically conductive transparent layer was measured for a light transmittance, and the above transparent electrically conductive layer was measured for a surface resistance, in the same manner as in Example 9. Further, the electrically conductive transparent glass was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 4 shows the results.

COMPARATIVE EXAMPLE 15

A transparent electrically conductive layer having a thickness of 350 nm was formed on a transparent glass substrate in the same manner as in Example 20 except that the sputtering target was replaced with a sputtering target of a sintered body formed of a compound (ITO) of indium oxide and tin oxide in which the atomic ratio of In to Sn, In/Sn, was 9/1.

In the so-obtained electrically conductive transparent glass, the transparent electrically conductive layer was analyzed for crystallizability by X-ray diffraction to show a sharp peak of $In_2O_3$.

The above electrically conductive transparent glass was measured for a light transmittance, and the above transparent electrically conductive layer was measured for a surface resistance, in the same manner as in Example 9. Further, the electrically conductive transparent glass was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 4 shows the results.

COMPARATIVE EXAMPLE 16

A transparent electrically conductive layer having a thickness of 200 nm was formed on a transparent glass substrate in the same manner as in Example 23 except that the sputtering target was replaced with a sputtering target of a sintered body formed of a compound (ITO) of indium oxide and tin oxide in which the atomic ratio of In to Sn, In/Sn, was 9/1.

In the so-obtained electrically conductive transparent glass, the transparent electrically conductive layer was analyzed for crystallizability by X-ray diffraction to show a slight peak of $In_2O_3$.

The above electrically conductive transparent glass was measured for a light transmittance, and the above transparent electrically conductive layer was measured for a surface resistance, in the same manner as in Example 9. Further, the electrically conductive transparent glass was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 4 shows the results.

COMPARATIVE EXAMPLE 17

A transparent electrically conductive layer having a thickness of 250 nm was formed on a transparent glass substrate in the same manner as in Example 23 except that the sputtering target was replaced with a target of indium oxide containing zinc oxide (sintered body in which atomic ratio of In, In/(In+Zn), was 0.90).

In the so-obtained electrically conductive transparent glass, the transparent electrically conductive layer was measured for a composition by ICP to show that the atomic ratio of In, In/(In+Zn), was 0.93. Further, the transparent electrically conductive layer was analyzed for crystallizability by X-ray diffraction to show that it was amorphous.

The above electrically conductive transparent: glass was measured for a light transmittance, and the above transparent electrically conductive layer was measured for a surface resistance, in the same manner as in Example 9. Further, the electrically conductive transparent glass was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 4 shows the results.

COMPARATIVE EXAMPLE 18

A transparent electrically conductive layer having a thickness of 250 nm was formed on a transparent glass substrate in the same manner as in Example 25 except that the sputtering target was replaced with a target of indium oxide containing zinc oxide (sintered body in which atomic ratio of In, In/(In+Zn), was 0.90).

In the so-obtained electrically conductive transparent glass, the transparent electrically conductive film was measured for a composition by ICP to show that the atomic ratio of In, In/(In+Zn), was 0.93. Further, the transparent electrically conductive layer was analyzed for crystallizability by X-ray diffraction to show that it was amorphous.

The above electrically conductive transparent glass was measured for a light transmittance, and the above transparent electrically conductive layer was measured for a surface resistance, in the same manner as in Example 9. Further, the electrically conductive transparent glass was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 4 shows the results.

COMPARATIVE EXAMPLE 19

A transparent electrically conductive layer having a thickness of 250 nm was formed on a transparent glass substrate in the same manner as in Example 26 except that the sputtering target was replaced with a target of indium oxide containing zinc oxide (sintered body in which atomic ratio of In, In/(In+Zn), was 0.93).

In the so-obtained electrically conductive transparent glass, the transparent electrically conductive layer was measured for a composition by ICP to show that the atomic ratio of In, In/(In+Zn), was 0.97. Further, the transparent electrically conductive layer was analyzed for crystallizability by X-ray diffraction to show that it was amorphous.

The above electrically conductive transparent glass was measured for a light transmittance, and the above transparent electrically conductive film was measured for a surface resistance, in the same manner as in Example 9. Further, the electrically conductive transparent glass was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 4 shows the results.

COMPARATIVE EXAMPLE 20

A transparent electrically conductive layer having a thickness of 220 nm was formed on a transparent glass substrate in the same manner as in Example 23 except that the sputtering target was replaced with a target prepared by arranging three indium oxide tablets (diameter 10 mm, thickness 5 mm) on a zinc oxide disk having a diameter of 4 inches.

In the so-obtained electrically conductive transparent glass, the transparent electrically conductive layer was measured for a composition by ICP to show that the atomic ratio of In, In/(In+Zn), was 0.12. Further, the transparent electrically conductive layer was analyzed for crystallizability by X-ray diffraction to show that it was amorphous.

The above electrically conductive transparent glass was measured for a light transmittance, and the above transparent electrically conductive layer was measured for a surface resistance, in the same manner as in Example 9. Further, the electrically conductive transparent glass was tested for a resistance to moist heat in the same manner as in Example 9. Then, the surface resistance and the light transmittance after a test time of 1,000 hours were measured in the same manner as in Example 9. Further, the transparent electrically conductive layer was measured for an etching rate in the same manner as in Example 9. Table 4 shows the results.

TABLE 4

| | Transparent electrically conductive layer | | | Transmittance to light | |
|---|---|---|---|---|---|
| | Atomic ratio of In | Third element *1 | Crystal system | Before test | After test |
| Ex.20 | 0.67 | — | amorphous | 85.2 | 84.9 |
| Ex.21 | 0.67 | — | amorphous | 85.3 | 85.1 |
| Ex.22 | 0.67 | Sn(0.04) | amorphous | 82.3 | 82.1 |
| Ex.23 | 0.70 | — | amorphous | 86.3 | 86.2 |
| Ex.24 | 0.74 | — | amorphous | 85.5 | 85.3 |
| Ex.25 | 0.73 | — | amorphous | 85.4 | 85.3 |
| Ex.26 | 0.73 | — | amorphous | 85.6 | 85.4 |
| Ex.27 | 0.72 | — | amorphous | 87.0 | 86.8 |
| CEx.15 | (ITO) | — | crystalline | 83.4 | 83.1 |
| CEx.16 | (ITO) | — | crystalline | 86.3 | 85.9 |
| CEx.17 | 0.93 | — | amorphous | 85.6 | 84.6 |
| CEx.18 | 0.93 | — | crystalline | 85.4 | 85.2 |
| CEx.19 | 0.97 | — | amorphous | 84.6 | 83.7 |
| CEx.20 | 0.12 | — | amorphous | 83.2 | 81.7 |

| | Surface resistance (Ω/□) | | Specific resistance*2 | | Layer thickness (nm) | Etching rate (nm/minute) |
|---|---|---|---|---|---|---|
| | Before test | After test | Before test | After test | | |
| Ex.20 | 7.5 | 1.7 | 2.3 | 2.4 | 310 | 355 |
| Ex.21 | 8.5 | 8.7 | 2.4 | 2.4 | 280 | 355 |
| Ex.22 | 5.6 | 7.2 | 1.7 | 2.2 | 300 | 360 |
| Ex.23 | 17.5 | 17.8 | 3.5 | 3.6 | 200 | 380 |
| Ex.24 | 13.5 | 14.0 | 3.4 | 3.5 | 250 | 370 |
| Ex.25 | 8.6 | 8.9 | 2.2 | 2.2 | 250 | 360 |
| Ex.26 | 12.5 | 12.9 | 3.1 | 3.2 | 250 | 375 |

TABLE 4-continued

| Ex.27 | 18.0 | 18.5 | 3.6 | 3.7 | 200 | 375 |
|---|---|---|---|---|---|---|
| CEx.15 | 5.0 | 5.0 | 1.8 | 1.8 | 350 | 3.5 |
| CEx.16 | 21.0 | 27.3 | 4.2 | 5.5 | 200 | 95 |
| CEx.17 | 20.0 | 20.5 | 5.0 | 5.1 | 250 | 150 |
| CEx.18 | 1,250 | 1,380 | 310 | 350 | 250 | 12 |
| CEx.19 | 18.0 | 18.5 | 4.5 | 4.6 | 250 | 120 |
| CEx.20 | 260 | 310 | 57 | 68 | 220 | 350 |

Ex. = Example, CEx. = Comparative Example
*1: parenthesized figure shows an atomic ratio of third element, (third element)/(In + Zn + third element).
*2: Unit = × $10^{-4}$ Ωcm As is clear in Table 4, pieces of the electrically conductive transparent glass obtained in Examples 20 to 27 had practically sufficient electrical conductivity and light transmittance. The surface resistance (specific resistance) of each electrically conductive transparent glass tested on resistance to moist heat showed only a small change from the surface resistance which each showed before the test on resistance to moist heat, so that it is seen that each electrically conductive transparent glass was excellent in resistance to moist heat. Further, the transparent electrically conductive layers (transparent electrically conductive layers I or II) constituting the pieces of the electrically conductive transparent glass obtained in Examples 20 to 27 had high etching rates, so that it is seen that the transparent electrically conductive layers were excellent in etching properties.

On the other hand, the electrically conductive transparent glass of Comparative Example 15 in which a crystalline ITO layer was formed as a transparent electrically conductive layer was excellent in electrical conductivity, light transmittance and resistance to moist heat, while the etching rate of the crystalline ITO layer constituting the electrically conductive transparent glass was far lower than those of the layers in Examples 20 to 27. The electrically conductive transparent glass of Comparative Example 16 in which the crystallite ITO layer was formed as a transparent electrically conductive layer was superior to the glass of Comparative Example 15 in the etching properties (etching rate) of transparent electrically conductive layer, while the etching rate of the ITO layer in Comparative Example 16 was still lower than those of the layers in Examples 20 to 27. Further, the electrically con-ductive transparent glass of Comparative Example 16 was also inferior to those of Examples 20 to 27 in resistance to moist heat. Those of Comparative Examples 17 and 19 had practically sufficient electrical conductivity and light transmittance, and had excellent resistance to moist heat, while they were inferior to those of Examples 20 to 27 in etching properties (etching rate). Further, those of Comparative Examples 18 and 20 had low electrical conductivity.

EXAMPLE 28

A biaxially oriented polyester film having a thickness of 100 μm was used as a transparent polymer substrate and a target prepared by placing three sintered bodies of ZnO (diameter 10 mm, thickness 5 mm, relative density 80%) on a sintered body of $In_2O_3$ (diameter 4 inches, thickness 5 mm, relative density 73%) was used as a sputtering target for forming a transparent electrically conductive layer I on the above polyester film in the following manner.

First, the above polyester film was set in an RF sputtering apparatus, and the pressure in a vacuum chamber was reduced to $1 \times 10^{-3}$ Torr. Then, a gas mixture of argon gas (purity 99.99%) and oxygen gas (purity 99.99%) (oxygen concentration=0.28%) was introduced up to $1 \times 10^{-1}$ Torr.

The above transparent electrically conductive layer I having a thickness of 273 nm was formed on the above polyester film under the conditions where the RF output was 1.2 W/cm$^2$ and the substrate temperature was 20° C.

The so-obtained transparent electrically conductive layer I was measured by X-ray diffraction to show that it was amorphous. Further, the transparent electrically conductive layer I was analyzed by ICP to show that the atomic ratio of In, In/(In+Zn), was 0.88.

The above transparent electrically conductive layer I was measured for a surface resistance and a light transmittance (wavelength of test light: 550 nm), and also measured for an etching rate in the same manner as in Example 9. Further, the specific resistance thereof was calculated. Table 5 shows the results.

EXAMPLE 29

An alkali-free glass plate (#7059, supplied by Corning) was used as a transparent glass substrate, and a transparent electrically conductive layer I having a thickness of 200 nm was formed on the above glass plate under the same conditions as those in Example 28.

The so-obtained transparent electrically conductive layer I was measured by X-ray diffraction to show that it was amorphous. Further, the transparent electrically conductive layer I was analyzed by ICP to show that the atomic ratio of In, In/(In+Zn), was 0.88.

The above transparent electrically conductive layer I was measured for a surface resistance, a light transmittance and an etching rate in the same manner as in Example 28. Further, the transparent electrically conductive layer I was heated at 200° C. for 1 hour, and then measured for a surface resistance. Further, the specific resistance values of the transparent electrically conductive layer I before and after the heating were calculated. Table 5 shows the results.

EXAMPLE 30

A transparent electrically conductive layer I having a thickness of 100 nm was formed on the same glass plate as that used in Example 29 under the same conditions as those in Example 29 except that the substrate temperature was set at 2000° C.

The so-obtained transparent electrically conductive layer I was measured by X-ray diffraction to show that it was amorphous. Further, the transparent electrically conductive layer I was analyzed by ICP to show that the atomic ratio of In, In/(In+Zn), was 0.88.

The above transparent electrically conductive layer I was measured for a surface resistance, a light transmittance and an etching rate in the same manner as in Example 28. Further, the transparent electrically conductive layer I was heated at 200° C. for 1 hour, and then measured for a surface resistance. Further, the specific resistance values of the transparent electrically conductive layer I before and after the heating were calculated. Table 5 shows the results.

EXAMPLE 31

A transparent electrically conductive layer I having a thickness of 300 nm was formed on the same polyester film as above under the same conditions as those in Example 1 except that the sputtering target was replaced with a target of a sintered body formed of a hexagonal laminar compound of $In_2O_3(ZnO)_3$, and $In_2O_3$ (atomic ratio of In, In/(In+Zn)= 0.84, relative density 86%).

The so-obtained transparent electrically conductive layer I was measured by X-ray diffraction to show that it was amorphous. Further, the transparent electrically conductive layer I was analyzed by ICP to show that the atomic ratio of In, In/(In+Zn), was 0.88.

The above transparent electrically conductive layer I was measured for a surface resistance, a light transmittance and an etching rate in the same manner as in Example 28. Further, the specific resistance thereof was calculated. Table 5 shows the results.

EXAMPLE 32

An alkali-free glass plate (#7059, supplied by Corning) was used as a transparent glass substrate, and a transparent electrically conductive layer I having a thickness of 250 nm was formed on the above glass plate under the same conditions as those in Example 31.

The so-obtained transparent electrically conductive layer I was measured by X-ray diffraction to show that it was amorphous. Further, the transparent electrically conductive layer I was analyzed by ICP to show that the atomic ratio of In, In/(In+Zn), was 0.87.

The above transparent electrically conductive layer I was measured for a surface resistance, a light transmittance and an etching rate in the same manner as in Example 28. Further, the transparent electrically conductive layer I was heated at 200° C. for 1 hour, and then measured for a surface resistance. Further, the specific resistance values of the transparent electrically conductive layer I before and after the heating were calculated. Table 5 shows the results.

EXAMPLE 33

A transparent electrically conductive layer I having a thickness of 210 nm was formed on the same glass plate as above under the same conditions as those in Example 32 except that the sputtering target was replaced with a target of a sintered body formed of a hexagonal laminar compound of $In_2O_3(ZnO)$, and $In_2O_3$ (atomic ratio of In, In/(In+Zn)= 0.80, relative derLsity 87%).

The so-obtained transparent electrically conductive layer I was measured by X-ray diffraction to show that it was amorphous. Further, the transparent electrically conductive layer I was analyzed by ICP to show that the atomic ratio of In, In/(In+Zn), was 0.84.

The above transparent electrically conductive layer I was measured for a surface resistance, a light transmittance and an etching rate in the same manner as in Example 28. Further, the transparent electrically conductive layer I was heated at 200° C. for 1 hour, and then measured for a surface resistance. Further, the specific resistance values of the transparent electrically conductive layer I before and after the heating were calculated. Table 5 shows the results.

EXAMPLE 34

A transparent electrically conductive layer II having a thickness of 100 nm was formed on the same glass plate as above under the same conditions as those in Example 32 except that the sputtering target was replaced with a target of a sintered body formed of a hexagonal laminar compound of $In_2O_3(ZnO)_3$, $In_2O_3$, and $SnO_2$ (atomic ratio of In, In/(In+Zn)=0.84, atomic ratio of Sn, Sn/(In+Zn+Sn)=0.02, relative density 82%) and that the substrate temperature was set at 200° C.

The so-obtained transparent electrically conductive layer II was measured by X-ray diffraction to show that it was amorphous. Further, the transparent electrically conductive layer II was analyzed by ICP to show that the atomic ratio of In, In/(In+Zn), was 0.87 and that the atomic ratio of Sn, Sn/(In+Zn+Sn) was 0.02.

The above transparent electrically conductive layer II was measured for a surface resistance, a light transmittance and an etching rate in the same manner as in Example 23. Further, the transparent electrically conductive layer II was heated at 200° C. for 1 hour, and then measured for a surface resistance. Further, the specific resistance values of the transparent electrically conductive layer II before and after the heating were calculated. Table 5 shows the results.

COMPARATIVE EXAMPLE 21

A transparent electrically conductive layer having a thickness of 300 nm was formed on the same glass plate as above under the same conditions as those in Example 29 except that the sputtering target was replaced with a sputtering target of a sintered body formed of a hexagonal laminar compound of $In_2O_3(ZnO)_3$, and $In_2O_3$ (atomic ratio of In, In/(In+Zn)=0.90, relative density 80%).

The so-obtained transparent electrically conductive layer was measured by X-ray diffraction to show that it was amorphous. Further, the transparent electrically conductive layer was analyzed by ICP to show that the atomic ratio of In, In/(In+Zn), was outside the range defined by the present invention, or 0.93.

The above transparent electrically conductive layer was measured for a surface resistance, a light transmittance and an etching rate in the same manner as in Example 28. Further, the transparent electrically conductive layer was heated at 200° C. for 1 hour, and then measured for a surface resistance. Further, the specific resistance values of the transparent electrically conductive layer before and after the heating were calculated. Table 5 shows the results.

COMPARATIVE EXAMPLE 22

A transparent electrically conductive layer having a thickness of 100 nm was formed on the same glass plate as above under the same conditions as those in Example 30 except that the sputtering target was replaced with a target of ITO ($In_2O_3$—5 wt % $SnO_2$).

The so-obtained transparent electrically conductive layer was measured by X-ray diffraction to show a crystal of indium oxide.

The above transparent electrically conductive layer was measured for a surface resistance, a light transmittance and an etching rate in the same manner as in Example 1. Table 5 shows the results.

EXAMPLE 35

An epoxy resin (epoxy acrylate) layer having a thickness of 1pm was formed on a transparent polymer substrate by a spin coating method, and the epoxy resin was crosslinked by exposing it to UV to form a crosslinked resin layer. Thereafter, a transparent electrically conductive layer I having a thickness of 200nm was formed on the above crosslinked resin layer in the same manner as in Example 33.

The so-obtained transparent electrically conductive layer I was measured by X-ray diffraction to show that it was amorphous. Further, the transparent electrically conductive layer I was analyzed by ICP to show that the atomic ratio of In, In/(In+Zn), was 0.84.

The above transparent electrically conductive layer I was measured for a surface resistance, a light transmittance and an etching rate in the same manner as in Example 28. Further, the specific resistance thereof was calculated. Table 5 shows the results.

TABLE 5

| | Material of substrate *1 | Substrate temperature in forming layer | Target *2 | Atomic ratio of In in transparent electrically conductive layer*3 | Light transmittance (%) |
|---|---|---|---|---|---|
| Ex.28 | PE | 20° C. | Target A | 0.88 | 82.0 |
| Ex.29 | Glass | 20° C. | Target A | 0.88 | 83.0 |
| Ex.30 | Glass | 200° C. | Target A | 0.88 | 86.0 |
| Ex.31 | PE | 20° C. | Target B | 0.88 | 80.0 |
| Ex.32 | Glass | 20° C. | Target B | 0.87 | 83.0 |
| Ex.33 | Glass | 20° C. | Target C | 0.84 | 83.5 |
| Ex.34 | Glass | 200° C. | Target D | 0.87*4 | 86.0 |
| Ex.35 | PE* | 20° C. | Target C | 0.84 | 82.5 |
| CEx.21 | PE | 20° C. | Target E | 0.93 | 78.0 |
| CEx.22 | Glass | 200° C. | Target F | — | 84.0 |

| | Etching rate *5 | Surface resistance (Ω/$) Before heat treatment | Surface resistance (Ω/$) After heat treatment | Specific resistance (× 10⁻⁴Xcm) Before heat treatment | Specific resistance (× 10⁻⁴Xcm) After heat treatment | Layer thickness (nm) |
|---|---|---|---|---|---|---|
| Ex.28 | 2.0 | 12.7 | — | 3.5 | — | 273 |
| Ex.29 | 2.0 | 17.5 | 18.5 | 3.5 | 3.7 | 200 |
| Ex.30 | 2.0 | 35.3 | 36.5 | 3.5 | 3.7 | 100 |
| Ex.31 | 2.0 | 11.5 | — | 3.5 | — | 300 |
| Ex.32 | 2.0 | 14.4 | 15.0 | 3.6 | 3.8 | 250 |
| Ex.33 | 2.1 | 18.1 | 18.5 | 3.8 | 3.9 | 210 |
| Ex.34 | 1.9 | 32.5 | 33.0 | 3.3 | 3.3 | 100 |
| Ex.35 | 2.0 | 17.5 | — | 3.5 | — | 200 |
| CEx.21 | 1.8 | 12.5 | 80.0 | 3.8 | 24.0 | 300 |
| CEx.22 | 0.025 | 17.5 | — | 1.8 | — | 100 |

Ex. = Example, CEx. = Comparative Example
*1: PE stands for biaxially oriented polyester film. Glass stands for alkali-free glass. PE in Example 35 is provided with crosslinked resin layer.
*2: Target A stands for target prepared by placing three sintered bodies of ZnO on a sintered body of $In_2O_3$.
Target B stands for target of sintered body formed of hexagonal laminar compound of $In_2O_3(ZnO)_3$, and $In_2O_3$ (atomic ratio of In, In/(In + Zn) = 9.84).
Target C stands for target of sintered body formed of hexagonal laminar compound of $In_2O_3(ZnO)_4$, and $In_2O_3$ (atomic ratio of In, In/(In + Zn) = 0.80).
Target D stands for target of sintered body formed of hexagonal laminar compound of $In_2O_3(ZnO)_3$, and $In_2O_3$ and $SnO_2$ (atomic ratio of In, In/(In + Zn) = 0.84, atomic ratio of Sn, Sn/(In + Zn + Sn) = 0.02).
Target E stands for target of sintered body formed of hexagonal laminar compound of $In_2O_{3(ZnO)3}$, and $In_2O_3$ (atomic ratio of In, In/(In + Zn) = 0.90).
Target F stands for target of ITO ($In_2O_3$-5 wt % $SnO_2$.
*3: Showing value of In/(In + Zn).
*4: The atomic ratio of Sn, Sn/(In + Zn + Sn), is 0.02.
*5: Unit = 1 m/minute As is clear in Table 5, the transparent electrically conductive layers obtained in Examples 28 to 35 not only had practically sufficient electrical conductivity and transparency, but also had excellent etching properties. Further, as is clear from the specific resistance values calculated before and after the heat treatment, it is seen that the transparent electrically conductive layers obtained in Examples 29, 30, 32, 33, 34 and 35 were excellent in thermal stability of specific resistance. Meanwhile, the transparent electrically conductive layers obtained in Examples 28, 31 and 35 had not been heat-treated for making sure the thermal stability of specific resistance since the substrates therefor had low heat resistance. However, the transparent electrically conductive layer obtained in Example 28 was quality-wise substantially identical with the transparent electrically conductive layer obtained in Example 29. The transparent electrically conductive layer obtained in Example 31 was quality-wise substantially identical with the transparent electrically conductive layer obtained in Example 32. Further, the transparent electrically conductive layer obtained in Example 35 was quality-wise substantially identical with the transparent electrically conductive layer obtained in Example 33. It can be therefore considered that the transparent electrically conductive layers obtained in Examples 28, 31 and 35 were also excellent in thermal stability of specific resistance.

On the other hand, the transparent electrically conductive layer of Comparative Example 21, in which the atomic ratio of In, In/(In+Zn), was outside the range defined by the present invention, had practically sufficient electrical conductivity and transparency and had excellent etching properties, while it had very low thermal stability of specific resistance. Further, the crystalline transparent electrically conductive layer obtained in Comparative Example 22 using the target of ITO was excellent in electrical conductivity and transparency, while it was inferior to the transparent electrically conductive layers of Examples 28 to 35 in etching properties.

All the transparent electrically conductive layers obtained in Examples 28 to 35 were excellent in resistance to moist heat.

EXAMPLE 36
(1) Preparation of Electrically Conductive Material I (powder)

First, 70.97 g of indium oxide and 89.25 g of zinc nitrate were dissolved in 1 liter of ion-exchanged water to prepare an aqueous solution containing indium salt and zinc salt. Further, 78 g of aqueous ammonia (concentration 28%) was dissolved in 750 cc of ion-exchanged water to prepare an alkaline aqueous solution.

Then, the above-obtained aqueous solution and the above-obtained alkaline aqueous solution were simultaneously added dropwise to a container containing 100 cc of ion-exchanged water and having a volume of 5 liters, with vigorously stirring at a room temperature, to allow these two solutions to react. During the addition dropwise, the rate of the above addition was adjusted such that the reaction system maintained a pH of 9.0. After the addition, the mixture was further stirred for 1 hour. The above aqueous solution and the above alkaline aqueous solution were allowed to react as described above, to form a precipitate, and a slurry was obtained. The concentration of the total amount of In and Zn in the reaction system was 0.3 mol/liter.

Then, the above-obtained slurry was fully washed with water, and the precipitate was recovered by filtration. The recovered precipitate was dried at 120° C. overnight, and fired at 900° C. for 5 hours.

Thereafter, the above-obtained fired product was placed in a pot formed of polyamide having a volume of 80 cc, together with alumina balls having a diameter of 2 mm, and ethanol was added. The fired product was pulverized with a planetary ball mill for 2 hours.

The so-obtained powder was measured by X-ray diffraction to show the formation of a hexagonal laminar compound of $In_2O_3(ZnO)_3$, and its content was 60 wt %. Further, the powder was substantially homogeneous as a composition. The content of the hexagonal laminar compound was quantitatively determined with a powder X-ray diffraction apparatus according to the method described in "Ceramics Characterization Technique" (issued by Corporation of Ceramic Industry Society, 1987, pages 44–45) (The same measurement was carried out in Examples to be described below). Further, the powder was analyzed for a composition with XMA (X-ray microanalyzer).

The above-obtained powder was observed through an SEM (scanning electron microscope) to show that it had an average particle diameter of 0.12 μm and that the diameters thereof were substantially uniform.

Further, the above-obtained powder had a volume solid resistivity of 950 Ωcm. The powder showed a volume solid resistivity of as low as 1,000 Ωcm even after a 1,000 hours' test on resistance to moist heat under the conditions of 40° C. and 90 % RH, which shows that the powder was excellent in resistance to moist heat. The above "volume solid resistivity" (sometimes referred to as "powder resistivity") was determined by placing 1 g of a sample in a cylinder formed of a resin having an internal diameter of 10 mm, applying a pressure at 100 kg/cm², measuring a resistance with a tester and substituting measurement values in the following equation (the same determination was carried out in Examples to be described below).

$$\text{Volume solid resistivity } (\Omega\text{cm}) = \frac{\text{total resistance}(\Omega) \times \text{internal area of cylinder } (\text{cm}^2)}{\text{thickness of sample (cm)}}$$

(2) Preparation of Electrically Conductive Material I (sintered body)

First, the powder obtained in the above (1) was placed in a 10 mmφ mold, and preliminarily shaped with a press molding machine at a pressure of 100 kg/cm². Then, the shaped body was compressed with a cold isostatic press molding machine at a pressure of 4 t/cm², and sintered at 1,300° C. for 5 hours to give a sintered body.

The so-obtained sintered body was found to contain 80 wt % of a hexagonal laminar compound of $In_2O_3(ZnO)_3$, and the composition and particle diameters thereof were substantially uniform. The sintered body had a relative density of 95%.

EXAMPLE 37
(1) Preparation of Electrically Conductive Material I (powder)

First, 50.69 g of indium nitrate and 106.24 g of zinc nitrate were dissolved in 1 liter of ion-exchanged water to prepare an aqueous solution containing indium salt and zinc salt. This aqueous solution and an alkaline aqueous solution prepared in the same manner as in Example 36(1) were allowed to react in the same manner as in Example 36(1) to give a slurry. The concentration of the total amount of In and Zn in the reaction system was 0.3 mol/liter.

Then, the above-obtained slurry was fully washed with water, and a precipitate was recovered by filtration. The recovered precipitate was dried at 120° C. overnight, and fired at 900° C. for 5 hours.

Thereafter, the fired product was pulverized in the same manner as in Example 36(1) to give a powder.

The so-obtained powder was measured by X-ray diffraction to show the formation of a hexagonal laminar compound of $In_2O_3(ZnO)_5$, and its content was 60 wt %. Further, the powder was substantially homogeneous as a composition. The powder was observed through an SEM to show that it had an average particle diameter of 0.20 μm and that the diameters thereof were substantially uniform.

Further, the above-obtained powder had a volume solid resistivity of 700 Ωcm. The powder showed a volume solid resistivity of as low as 730 Ωcm even after a 1,000 hours' test on resistance to moist heat under the conditions of 40° C. and 90 % RH, which shows that the powder was excellent in resistance to moist heat.

(2) Preparation of Electrically Conductive Material I (sintered body)

The powder obtained in the above (1) was preliminarily shaped, and the shaped body was compressed, in the same manner as in Example 36(2), and the shaped body was sintered at 1,350° C. for 5 hours to give a sintered body.

The so-obtained sintered body was found to be formed of a hexagonal laminar compound of $In_2O_3(ZnO)$, and the composition and particle diameters thereof were substantially uniform. The sintered body had a relative density of 96%.

EXAMPLE 38

(1) Preparation of Electrically Conductive Material II (powder)

An aqueous solution containing indium salt and zinc salt was prepared in the same manner as in Example 37(1), and then 7.2 g (5 at %) of stannic chloride was added to the aqueous solution. This aqueous solution and an alkaline aqueous solution prepared in the same manner as in Example 36(1) were allowed to react in the same manner as in Example 36(1) to give a slurry.

Then, the above-obtained slurry was fully washed with water, and a precipitate was recovered by filtration. The recovered precipitate was dried at 120° C. overnight, and fired at 900° C. for 5 hours.

Thereafter, the fired product was pulverized in the same manner as in Example 36(1) to give a powder.

The so-obtained powder was measured by X-ray diffraction to show the formation of 60 wt % of $In_2O_3(ZnO)_5$.

The above powder had a volume solid resistivity of 330 Ωcm. The powder had a volume solid resistivity of as low as 350 Ωcm even after a 1,000 hours' test on resistance to moist heat under the conditions of 40° C. and 90% RH, which shows that the powder was excellent in resistance to moist heat.

(2) Preparation of Electrically Conductive Material II (sintered body)

The powder obtained in the above (1) was preliminarily shaped, and the shaped body was compressed, in the same manner as in Example 36(2), and the shaped body was sintered at 1,350° C. for 5 hours to give a sintered body.

The so-obtained sintered body was found to be a hexagonal laminar compound of $In_2O_3(ZnO)_5$ in an amount of 80 wt %, and the particle diameters thereof were substantially uniform. The sintered body had a relative density of 95%.

EXAMPLE 39

Preparation of Electrically Conductive Material I (sintered body)

278 Grams of indium oxide and 326 g of zinc oxide were placed in a pot formed of polyamide having an internal volume of 800 cc, together with alumina balls having a diameter of 2 mm, and ethanol was added. The mixture was pulverized and mixed with a planetary ball mill for 100 hours. Then, the mixture was calcined at 1,000° C. for 5 hours, and further pulverized and mixed with a planetary ball mill for 24 hours.

The so-obtained powder was placed in a mold having a diameter of 4 inches, and preliminarily shaped with a press molding machine at a pressure of 100 kg/cm². Then, the shaped body was compressed with a cold isostatic press molding machine at a pressure of 4 t/cm², and fired by hot isostatic pressing at 1,000 kgf/cm² at 1,300° C. for 3 hours to give a sintered body. The so-obtained sintered body was measured by X-ray diffraction to show that it was a hexagonal laminar compound of $In_2O_3(ZnO)_4$.

The so-obtained sintered body was analyzed by ICP (inductively coupled plasma atomic emission spectrochemical analysis) using SPS-1500VR supplied by Seiko Instruments Inc. to show that the atomic ratio of In, In/(In+Zn), was 0.33. Further, the sintered body had a relative density of 88%.

EXAMPLE 40

Preparation of Electrically Conductive Material I (sintered body)

175 Grams of indium oxide and 100 g of zinc oxide were placed in a pot formed of polyamide having an internal volume of 800 cc, together with alumina balls having a diameter of 2 mm, and ethanol was added. The mixture was pulverized and mixed with a planetary ball mill for 100 hours. Then, the mixture was calcined at 1,000° C. for 5 hours, and further pulverized and mixed with a planetary ball mill for 24 hours.

The so-obtained powder was placed in a mold having a diameter of 4 inches, and preliminarily shaped with a press molding machine at a pressure of 100 kg/cm². Then, the shaped body was compressed with a cold isostatic press molding machine at a pressure of 4 t/cm², and fired by hot isostatic pressing at 1,500 kgf/cm² at 1,450° C. for 3 hours to give a sintered body. The so-obtained sintered body was measured by X-ray diffraction to show that it was a mixture of a hexagonal laminar compound of $In_2O_3(ZnO)_5$, and $In_2O_3$.

The so-obtained sintered body was analyzed by ICP to show that the atomic ratio of In, In/(In+Zn), was 0.50. Further, the sintered body had a relative density of 93%.

EXAMPLE 41

Preparation of Electrically Conductive Material I (sintered body)

The pulverizing, mixing, calcining, molding and sintering were carried out in the same manner as in Example 40 except that 300 g of indium oxide and 80 g of zinc oxide were used. The so-obtained sintered body was measured by X-ray diffraction to show that it was a mixture of a hexagonal laminar compound of $In_2O_3(ZnO)_3$, and $In_2O_3$.

The so-obtained sintered body was analyzed by ICP to show that the atomic ratio of In, In/(In+Zn), was 0.67. Further, the sintered body had a relative density of 92%.

EXAMPLE 42

Preparation of Electrically Conductive Material I (sintered body)

The pulverizing, mixing, calcining, molding and sintering were carried out in the same manner as in Example 40 except that 278 g of indium oxide and 52 g of zinc oxide were used. The so-obtained sintered body was measured by X-ray diffraction to show that it was a mixture of a hexagonal laminar compound of $In_2O_3(ZnO)_3$, and $In_2O_3$.

The so-obtained sintered body was analyzed by ICP to show that the atomic ratio of In, In/(In+Zn), was 0.75. Further, the sintered body had a relative density of 96%.

EXAMPLE 43

Preparation of Electrically Conductive Material I (sintered body)

The pulverizing, mixing, calcining, molding and sintering were carried out in the same manner as in Example 40 except that 278 g of indium oxide and 38 g of zinc oxide were used. The so-obtained sintered body was measured by X-ray diffraction to show that it was a mixture of a hexagonal laminar compound of $In_2O_3(ZnO)_3$, and $In_2O_3$.

The so-obtained sintered body was analyzed by ICP to show that the atomic ratio of In, In/(In+Zn), was 0.80. Further, the sintered body had a relative density of 95%.

EXAMPLE 44

Preparation of Electrically Conductive Material I (sintered body)

The pulverizing, mixing, calcining and molding were carried out in the same manner as in Example 40 except that 278 g of indium oxide and 38 g of zinc oxide were used. The molded body was sintered by hot isostatic pressing at 1,000 kgf/cm$^2$ at 1,200° C. for 3 hours. The resultant sintered body was measured by X-ray diffraction to show that it was a mixture of a hexagonal laminar compound of $In_2O_3(ZnO)_5$, and $In_2O_3$.

The so-obtained sintered body was analyzed by ICP to show that the atomic ratio of In, In/(In+Zn), was 0.80. Further, the sintered body had a relative density of 82%.

EXAMPLE 45

Preparation of Electrically Conductive Material I (sintered body)

The pulverizing, mixing, calcining, molding and sintering were carried out in the same manner as in Example 40 except that 278 g of indium oxide and 27.5 g of zinc oxide were used. The resultant sintered body was measured by X-ray diffraction to show that it was a mixture of a hexagonal laminar compound of $In_2O_3(ZnO)_3$, and $In_2O_3$.

The so-obtained sintered body was analyzed by ICP to show that the atomic ratio of In, In/(In+Zn), was 0.85%. Further, the sintered body had a relative density of 95%.

EXAMPLE 46

(1) Preparation of Electrically Conductive Material I (powder)

435 Grams of indium chloride tetrahydrate and 50.3 g of zinc acetate dihydrate were dissolved in 2.5 liters of methoxyethanol to prepare a solution A.

Separately, 250 g of oxalic acid dihydrate was dissolved in 2.5 liters of ethanol to prepare a solution B.

At room temperature, 0.5 liter of ethanol was placed in a container and while it was stirred, the solution A and the solution B were simultaneously dropwise added at the controlled same flow rates. After the addition, the reaction mixture was temperature-increased to 40° C. and a formed precipitate was aged for 4 hours. Then, the precipitate was recovered by filtration, washed with ethanol and dried at 110° C. for 12 hours, and further, it was fired at 700° C. for 5 hours. The resultant product was placed in a pot formed of polyamide having an internal volume of 800 cc, together with alumina balls having a diameter of 2 mm, and ethanol was added. The mixture was pulverized and mixed with a planetary ball mill for 100 hours. Then, the mixture was calcined at 1,000° C. for 5 hours, and further pulverized and mixed with a planetary ball mill for 24 hours. This pulverizing and mixing gave a powder which came under the electrically conductive material I.

(2) Preparation of Electrically Conductive Material I (sintered body)

The powder obtained in the above (1) was placed in a mold having a diameter of 4 inches, and preliminarily shaped with a press molding machine at a pressure of 100 kg/cm$^2$. Then, the shaped body was compressed with a cold isostatic press molding machine at a pressure of 4 t/cm$^2$, and fired by hot isostatic pressing at 1,500 kgf/cm$^2$ at 1,450° C. for 3 hours. The resultant sintered body was measured by X-ray diffraction to show that it was a mixture of a hexagonal laminar compound of $In_2O_3(ZnO)_4$, and $In_2O_3$.

The so-obtained sintered body was analyzed by ICP to show that the atomic ratio of In, In/(In+Zn), was 0.85. Further, the sintered body had a relative density of 95%.

EXAMPLE 47

Preparation of Electrically Conductive Material II (sintered body)

The pulverizing, mixing, calcining, molding and sintering were carried out in the same manner as in Example 45 except that 5 at % of Sn was added as a third element. The resultant sintered body was measured by X-ray diffraction to show that it was a mixture of a hexagonal laminar compound of $In_2O_3(ZnO)_3$, and $In_2O_3$.

The so-obtained sintered body was analyzed by ICP to show that the atomic ratio of In, In/(In+Zn), was 0.85 and that the atomic ratio of Sn, Sn/(In+Zn+Sn), was 0.05. Further, the sintered body had a relative density of 92%.

EXAMPLE 48

(1) Preparation of Powder Containing $In_2O_3(ZnO)_5$ Hexagonal Laminar Compound (coming under the electrically conductive material I).

350.5 Grams of indium nitrate hexahydrate and 637.5 g of zinc nitrate hexahydrate were dissolved in 5.00 liters of ethanol to prepare a solution A.

Separately, 475.4 g of oxalic acid dihydrate was dissolved in 5.00 liters of ethanol to prepare a solution B.

At room temperature, 1.00 liter of ethanol was placed in a container and while it was stirred, the solution A and the solution B were simultaneously dropwise added at the controlled same flow rates. After the addition, the reaction mixture was temperature-increased to 40° C. and a formed precipitate was aged for 4 hours. Then, the precipitate was recovered by filtration, washed with ethanol and dried at 110° C. for 12 hours. Further, it was fired at 700° C. for 4 hours. The resultant product was pulverized with a ball mill (20 hours), and then resultant powder was reduction-treated under vacuum at 300° C. for 4 hours to give a yellowish powder.

The so-obtained powder was measured by X-ray diffraction to show the formation of 70 wt % of $In_2O_3(ZnO)_5$. Further, the powder was measured for a volume solid resistivity to show 25 Ωcm. The powder still showed a volume solid resistivity of 32 Ωcm after a 1,000 hours' test on humidity resistance under the conditions of 40° C. and 90% RH, which shows that the powder was excellent in humidity resistance. The powder was also analyzed with SEM and XMA to show that it had an average particle diameter of 0.22 μm and had a homogeneous composition.

(2) Preparation of Sintered Body Containing $In_2O_3(ZnO)_5$ Hexagonal Laminar Compound (coming under the electrically conductive material).

Polyvinyl alcohol in an amount of 2 wt % was added to the powder obtained in the above (1), and the mixture was press-shaped at 100 kg/cm$^2$ in a mold having a diameter of 150 mm. Further, the shaped body was compressed by cold isostatic pressing at 4 t/cm$^2$.

The so-obtained shaped body was decreased at 500° C. for 10 minutes, and then sintered at 1,200° C. for 4 hours. The so-obtained sintered body was measured by X-ray diffraction to show the formation of 90 wt % of $In_2O_3(ZnO)_5$. This sintered body had a density of 92% and a volume resistivity of 5×10$^{-3}$ Ωcm.

EXAMPLE 49

(1) Preparation of Powder Containing $In_2O_3(ZnO)_3$ Hexagonal Laminar Compound (coming under the electrically conductive material).

293.2 Grams of indium chloride tetrahydrate and 351.2 g of zinc acetate dihydrate were dissolved in 5.00 liters of ethanol to prepare a solution A.

Separately, 415.9 g of oxalic acid dihydrate was dissolved in 5.00 liters of ethanol to prepare a solution B.

A yellowish powder was obtained from the solution A and the solution B in the same manner as in Example 48(1). The powder was measured by X-ray diffraction to show the formation of 60 wt % of $In_2O_3(ZnO)_3$. Further, the powder was measured for a volume solid resistivity to show 18 Ωcm. The powder still showed a volume resistivity of 25 Ωcm after a 1,000 hours' test on humidity resistance under the conditions of 40° C. and 90% RH, which shows that the powder was excellent in humidity resistance. The powder was also analyzed with SEM and XMA to show that it had an average particle diameter of 0.15 μm and had a homogeneous composition.

(2) Preparation of Sintered Body Containing $In_2O_3(ZnO)_3$ Hexagonal Laminar Compound and $In_2O_3$ (coming under the electrically conductive material).

The powder obtained in the above (1) was treated in the same manner as in Example 48(2) to give a sintered body. The sintered body was measured by X-ray diffraction to show the formation of 80 wt % of $In_2O_3(ZnO)_3$. This sintered body had a density of 93% and a volume resistivity of $2 \times 10^{-3}$ Ωcm.

EXAMPLE 50

(1) Preparation of Powder Containing $In_2O_3(ZnO)_5$ Hexagonal Laminar Compound Containing Tin (coming under electrically conductive material II)

350.5 Grams of indium nitrate hexahydrate, 637.5 g of zinc nitrate hexahydrate and 108 g of tin acetyl acetonate $((Sn(C_4H_9)_2(C_5H_7O_2)_2))$ were dissolved in 5.00 liters of methoxyethanol to prepare a solution A.

Separately, 472.5 g of oxalic acid dihydrate was dissolved in 5.00 liters of ethanol to prepare a solution B.

A powder was prepared from the above solutions A and B in the same manner as in Example 48(1). This powder was also yellowish.

The powder was measured by X-ray diffraction to show the formation of 60 wt % of $In_2O_3(ZnO)_5$. Further, the powder was measured for a volume solid resistivity to show 15 Ωcm. The powder still showed a volume solid resistivity of 19 Ωcm after a 1,000 hours' test on humidity resistance under the conditions of 40° C. and 90% RH, which shows that the powder was excellent in humidity resistance. The powder was also analyzed with SEM and XMA to show that it had an average particle diameter of 0.21 μm and had a homogeneous composition.

(2) Preparation of Sintered Body Containing $In_2O_3(ZnO)_5$ Hexagonal Laminar Compound Containing Tin (coming under electrically conductive material II)

A sintered body was obtained from the powder obtained in the above (1), in the same manner as in Example 18(2). The sintered body was measured by X-ray diffraction to show the formation of 80 wt % of $In_2O_3(ZnO)_5$. Further, the sintered body had a density of 91% and a volume resistivity of $1 \times 10^{-3}$ Ωcm.

EXAMPLE 51

First, 118.28 g of indium nitrate and 49.58 g of zinc nitrate were dissolved in 1 liter of ion-exchanged water to prepare an aqueous solution containing indium salt and zinc salt. Further, 78.0 g of aqueous ammonia (concentration 28%) was dissolved in 750 cc of ion-exchanged water to prepare an alkaline aqueous solution.

Then, the above-obtained aqueous solution and the above-obtained alkaline aqueous solution were simultaneously added dropwise to a container containing 100 cc of ion-exchanged water and having a volume of 5 liters, with vigorously stirring at a room temperature, to allow these two solutions to react. During the addition dropwise, the rate of the above addition was adjusted such that the reaction system maintained a pH of 9.0. After the addition, the mixture was further stirred. for 1 hour. The above aqueous solution and the above alkaline aqueous solution were allowed to react as described above, to form a precipitate, and a slurry was obtained. The concentration of the total amount of In and Zn in the reaction system was 0.32 mol/liter.

Then, the above-obtained slurry was fully flashed with water, and the precipitate was recovered by filtration. The recovered precipitate was dried at 120° C. overnight.

Thereafter, the above-obtained dry product was fired at 600° C. for 5 hours, and then placed in a pot formed of polyamide having a volume of 80 cc, together with alumina balls having a diameter of 2 mm, and ethanol was added. The above product was pulverized with a planetary ball mill for 2 hours to give a powder.

The so-obtained powder was measured by X-ray diffraction to show that 60 wt % of the powder was amorphous content, and it was also analyzed for a composition to show that the atomic ratio of In, In/(In+Zn), was 0.66. The powder was substantially homogeneous as a composition. This powder comes under the electrically conductive material III. In the quantitative determination of the amorphous oxide, the content of a crystalline substance was quantitatively determined with a powder X-ray diffraction apparatus according to the method described in "Ceramics Characterization Technique" (issued by Corporation of Ceramic Industry Society, 1987, pages 44–45), and the remainder was taken as the amorphous oxide (The measurement in Examples to be described below was carried out in this manner).

Further, the above-obtained powder was observed through an SEM (scanning electron microscope) to show that it had an average particle diameter of 0.15 μm and that the diameters thereof were substantially uniform.

The above-obtained powder had a volume solid resistivity of 100 Ωcm. The powder showed a volume solid resistivity of as low as 105 Ωcm even after a 1,000 hours' test on humidity resistance under the conditions of 40° C. and 90% RH (relative humidity), which shows that the powder was excellent in humidity resistance.

EXAMPLE 52

First, 59.14 g of indium nitrate and 99.16 g of zinc nitrate were dissolved in 1 liter of ion-exchanged water to prepare an aqueous solution containing indium salt and zinc salt. This aqueous solution and an alkaline aqueous solution prepared in the same manner as in Example 51 were allowed to react in the same manner as in Example 51 to give a slurry. The concentration of the total amount of In and Zn in the reaction system was 0.3 mol/liter.

Then, the above-obtained slurry was fully washed with water, and a precipitate was recovered by filtration. The recovered precipitate was dried at 120° C. overnight.

Thereafter, the above-obtained dry product was fired at 500° C. for 5 hours, and then the fired product was pulverized in the same manner as in Example 1 to give a powder.

The so-obtained powder was measured by X-ray diffraction to show that 70 wt % of the powder was amorphous content, and it was also analyzed for a composition to show that the atomic ratio of In, In/(In+Zn), was 0.33. The powder was substantially homogeneous as a composition. This powder comes under the electrically conductive material III.

Further, the above-obtained powder was observed through an SEM to show that it had an average particle diameter of 0.23 μm and that the diameters thereof were substantially uniform.

The above-obtained powder had a volume solid resistivity of 550 Ωcm. The powder showed a volume solid resistivity of as low as 560 Ωcm even after a 1,000 hours' test on humidity resistance under the conditions of 40° C. and 90% RH (relative humidity), which shows that the powder was excellent in humidity resistance.

EXAMPLE 53

An aqueous solution containing metal salts of indium and zinc was prepared in the same manner as in Example 51, and 7.7 g (5 at %) of cupric chloride was further added. The aqueous resultant solution and an alkaline aqueous solution prepared in the same manner as in Example 51 were allowed to react in the same manner as in Example 51 to give a slurry.

Then, the above-obtained slurry was fully washed with water, and then a precipitate was recovered by filtration. The recovered precipitate was dried at 120° C., and fired at 600° C. for 5 hours. The resultant product was placed in a pot formed of polyamide having a volume of 80 cc, together with ball mill, and ethanol was added. The above product was pulverized with a planetary ball mill for 2 hours.

Then, the resultant fired product was pulverized in the same manner as in Example 51 to give a powder. The so-obtained powder was measured by X-ray diffraction to show that 60 wt % of the powder was amorphous content. The powder was substantially homogeneous as a composition. This powder comes under the electrically conductive material III.

The above-obtained powder had a volume solid resistivity of 90 Ωcm. The powder showed a volume solid resistivity of as low as 100 Ωcm even after a 1,000 hours' test on humidity resistance under the conditions of 40° C. and 90% RH, which shows that the powder was excellent in humidity resistance.

EXAMPLE 54

First, 682 g of indium nitrate hexahydrate and 248 g of zinc nitrate hexahydrate were dissolved in 5 liters of ethanol to prepare a solution containing indium salt and zinc salt. Further, 462 g of oxalic acid dihydrate was dissolved in 5 liters of ethanol to prepare an oxalic acid aqueous solution.

At room temperature, 1 liter of ethanol was placed in a container and well stirred, and the above two solutions were simultaneously dropwise added at the controlled same flow rates. After the addition, the reaction mixture was temperature-increased to 40° C. and aged for 4 hours. Then, the mixture was filtered, and the remainder was well washed with ethanol and dried at 110° C. for 12 hours. Further, it was fired at 300° C. for 2 hours.

The resultant product was pulverized with a ball mill (20 hours), and then resultant powder was reduction-treated under vacuum at 200° C. for 2 hours to give a yellowish powder.

The so-obtained powder was measured by X-ray diffraction to show that 90 wt % of the powder was amorphous or that the powder was substantially amorphous. Further, the powder was analyzed for a composition to show that the atomic ratio of In, In/(In+Zn), was 0.67. This powder comes under the electrically conductive material III.

The above powder was measured for a volume solid resistivity to show 5 Ωcm. The powder still showed a volume solid resistivity of 6 Ωcm or showed almost no change after a 1,000 hours' test on humidity resistance under the conditions of 40° C. and 90% RH, which shows that the powder was excellent in humidity resistance.

The powder was also analyzed with SEM and KMA to show that it had an average particle diameter of 0.20 μm and had a homogeneous composition.

EXAMPLE 55

First, 623 g of indium chloride tetrahydrate and 82 g of zinc acetate dihydrate were dissolved in 5 liters of methoxy ethanol to prepare a solution containing indium salt and zinc salt. Further, 494 g of oxalic acid dihydrate was dissolved in 5 liters of methoxy ethanol to prepare an oxalic acid aqueous solution.

A powder was prepared from the above solutions in the same manner as in Example 54 except that the firing temperature is 350° C. This powder was also yellowish.

The powder was measured by X-ray diffraction to show that 80% of the powder was amorphous or that it was substantially amorphous. Further, the powder was analyzed for a composition to show that the atomic ratio of In, In/(In+Zn), was 0.85. This powder comes under the electrically conductive material III.

The above powder was measured for a volume solid resistivity to show 4 Ωcm. The powder still showed a volume solid resistivity of 6 Ωcm or showed almost no change after a 1,000 hours' test on humidity resistance under the conditions of 40° C. and 90% RH. This shows that the powder was excellent in humidity resistance.

The powder was also analyzed with SEM and XMA to show that it had an average particle diameter of 0.15 μm and had a homogeneous composition.

EXAMPLE 56

First, 682 g of indium nitrate hexahydrate, 248 g of zinc nitrate hexahydrate and 108 g of tin acetyl acetonate were dissolved in 5 liters of isopropanol to prepare a solution containing indium salt and zinc salt. Further, 532 g of oxalic acid dihydrate was dissolved in 5 liters of ethanol to prepare an oxalic acid aqueous solution.

A powder was prepared from the above solutions in the same manner as in Example 54. This powder was also yellowish.

The powder was measured by X-ray diffraction to show that 90% of the powder was amorphous or that it was substantially amorphous. Further, the powder was analyzed for a composition to show that the atomic ratio of In, In/(In+Zn), was 0.67 and the atomic ratio of tin, Sn/(In+Zn+Sn) was 0.09. This powder comes under the electrically conductive material IV.

The above powder was measured for a volume solid resistivity to show 4 Ωcm. The powder still showed a volume solid resistivity of 6 Ωcm or showed almost no change after a 1,000 hours' test on humidity resistance under the conditions of 40° C. and 90% RH. This shows that the powder was excellent in humidity resistance.

The powder was also analyzed with SEM and KMA to show that it had an average particle diameter of 0.17 μm and had a homogeneous composition.

EXAMPLE 57

First, 613 g of indium nitrate hexahydrate end 298 g of zinc nitrate hexahydrate were dissolved in 5 liters of butanol to prepare a solution containing indium salt and zinc salt. Further, 451 g of oxalic acid dihydrate was dissolved in 5 liters of butanol to prepare an oxalic acid aqueous solution.

A powder was prepared from the above solutions in the same manner as in Example 55. This powder was also yellowish.

The powder was measured by X-ray diffraction to show that 80% of the powder was amorphous or that it was substantially amorphous. Further, the powder was analyzed for a composition to show that the atomic ratio of In, In/(In+Zn), was 0.60. This powder comes under the electrically conductive material III.

The above powder was measured for a volume solid resistivity to show 20 Ωcm. The powder still showed a volume solid resistivity of 22 Ωcm or showed almost no change after a 1,000 hours' test on humidity resistance under the conditions of 60° C. and 65% RH. This shows that the powder was excellent in humidity resistance.

The powder was also analyzed with SEM and XMA to show that it had an average particle diameter of 0.19 μm and had a homogeneous composition.

EXAMPLE 58

First, 102 g of indium acetate hexahydrate and 42 g of zinc acetate were dissolved in 140 ml of monoethanolamine and 860 ml of ethanol to prepare a solution.

The solvent was removed from the above solution under reduced pressure at 80° C., and the remainder was fired at 400° C. for 1 hour to carry out the thermal decomposition thereof. Then, the resultant powder was reduction-treated under vacuum at 200° C. for 2 hours to give a yellowish powder.

The powder was measured by X-ray diffraction to show that 80% of the powder was amorphous or that it was substantially amorphous. Further, the powder was analyzed for a composition to show that the atomic ratio of In, In/(In+Zn), was 0.70. This powder comes under the electrically conductive material III.

The above powder was measured for a volume solid resistivity to show 7 Ωcm. The powder still showed a volume solid resistivity of 8 Ωcm or showed almost no change after a 1,000 hours' test on humidity resistance under the conditions of 60° C. and 95% RH, which shows that the powder was excellent in humidity resistance.

The powder was also analyzed with SEM and XMA to show that it had an average particle diameter of 0.15 μm and had a homogeneous composition.

As is explained hereinabove with reference to Examples and Comparative Examples, the transparent electrically conductive layers (transparent electrically conductive layer I and transparent electrically conductive layer II) of the present invention are transparent electrically conductive film which have practically sufficient electrical conductivity and light transmittance, and which are excellent in resistance to moist heat and etching properties. According to the present invention, therefore, there can be provided transparent electrically conductive films which are improved in durability and which can be easily shaped into desired forms by an etching method.

Further, the electrically conductive transparent substrates (electrically conductive transparent film and electrically conductive transparent glass) of the present invention are those which utilize the above transparent electrically conductive films, and since these transparent electrically conductive films have the above properties, they are suitable base materials for forming transparent electrodes, by an etching method, in various fields such as a transparent electrode for a liquid crystal display device, a transparent electrode for an electroluminescence device and a transparent electrode for a solar cell, or a film for the prevention of electrostatic charge or a heater for deicing on window glass.

We claim:

1. A transparent electrically conductive layer comprising an amorphous oxide containing indium (In) and zinc (Zn) as main cation elements and having an atomic ratio of In, In/(In+Zn), of 0.50 to 0.90.

2. The transparent electrically conductive layer of claim 1, wherein the transparent electrically conductive layer is a layer formed by a coating and thermal decomposition method.

3. The transparent electrically conductive layer of claim 2, wherein the atomic ratio of In, In/(In+Zn), is 0.6 to 0.8.

4. The transparent electrically conductive layer of claim 1, wherein the transparent electrically conductive layer is a layer formed by a sputtering method.

5. The transparent electrically conductive layer of claim 4, wherein the atomic ratio of In, In/(In+Zn), is 0.6 to 0.90.

6. The transparent electrically conductive layer of claim 4, wherein the atomic ratio of In, In/(In+Zn), is 0.8 to 0.90.

7. The transparent electrically conductive layer of claim 1, wherein the atomic ratio of In, In/(In+Zn), is 0.84 to 0.90.

8. A process for the production of a transparent electrically conductive layer, which comprises dissolving an indium compound and a zinc compound to prepare a coating solution in which the atomic ratio of In, In/(In+Zn), is a predetermined value, applying the coating solution to a substrate, firing a coating of the solution at 300 to 650° C., and reduction-treating the coating to form a transparent electrically conductive layer comprising an amorphous oxide containing indium (In) and zinc (Zn) as main cation elements in which the atomic ratio of In, In/(In+Zn), is 0.50 to 0.8.

9. The process of claim 8, wherein the indium compound is at least one member selected from the group consisting of carboxylic acid salts of indium and indium alkoxides, and the zinc compound is at least one member selected from the group consisting of carboxylic acid salts of zinc, inorganic zinc compounds and zinc alkoxides.

10. A process for the production of a transparent electrically conductive layer, which comprises providing (A) a target of a sintered body formed of an oxide containing indium and zinc as main components in which the atomic ratio of In, In/(In+Zn), is 0.45 to 0.9 or (B) a target formed of an oxide-containing disk and at least one oxide-containing tablet arranged on the disk, and forming a transparent electrically conductive layer comprising an amorphous oxide containing indium (In) and zinc (Zn) as main cation elements in which the atomic ratio of In, In/(In+Zn), is 0.50 to 0.90, by a direct sputtering method.

11. The process of claim 10, wherein the target of a sintered body formed of an oxide containing indium and zinc as main components is one selected from the group consisting of a sintered body formed of a mixture of indium oxide and zinc oxide; a sintered body formed substantially of at least one of hexagonal laminar compounds of $In_2O_3(ZnO)_m$ (m=2–20); and a sintered body formed substantially of at least one of hexagonal laminar compounds of $In_2O_3(ZnO)_m$ (m=2–20), and $In_2O_3$ and/or ZnO.

12. The process of claim 10, wherein the oxide-containing disk is one selected from the group consisting of a disk formed substantially of indium oxide; a disk of a sintered body formed substantially of at least one of hexagonal laminar compounds of $In_2O_3(ZnO)_m$ (m=2–20); and a disk of a sintered body formed substantially of at least one of hexagonal laminar compounds of $In_2O_3(ZnO)_m$ (m=2–20), and $In_2O_3$ and/or ZnO, and the oxide-containing tablet is one selected from the group consisting of a tablet formed substantially of zinc oxide or indium oxide; a tablet formed substantially of at least one of hexagonal laminar compounds of $In_2O_3(ZnO)_m$ (m=2–20); and a tablet formed substantially of at least one of hexagonal laminar compounds of $In_2O_3(ZnO)_m$ (m=2–20), and $In_2O_3$ and/or ZnO.

13. The process of claim 10, wherein the formed transparent electrically conductive layer has an atomic ratio of In, In/(In+Zn), of 0.84 to 0.90.

14. A transparent electrically conductive layer comprising an amorphous oxide comprising, as main cation elements, indium (In), zinc (Zn) and at least one other third element having a valence of at least 3, in which the atomic ratio of In, In/(In+Zn), is 0.50 to 0.90 and the atomic ratio of a total amount of the at least one other third element, (total of the at least one other third element/(In+Zn+total of the at least one other third element)), is 0.2 or less.

15. The transparent electrically conductive layer of claim 14, wherein the layer is formed by a coating and thermal decomposition method.

16. The transparent electrically conductive layer of claim 14, wherein the atomic ratio of In, In/(In+Zn), is 0.6 to 0.8.

17. The transparent electrically conductive layer of claim 14, wherein the layer is formed by a sputtering method.

18. The transparent electrically conductive layer of claim 17, wherein the atomic ratio of In, In/(In+Zn), is 0.6 to 0.90.

19. The electrically conductive transparent film of claim 18, wherein an adhesive layer of one substance selected from the group consisting of epoxy-containing substances, acrylurethane-containing substances and phenoxyether-containing substances, is provided between the transparent polymer substrate and the crosslinked resin layer.

20. The transparent electrically conductive layer of claim 17, wherein the atomic ratio of In, In/(In+Zn), is 0.8 to 0.90.

21. The transparent electrically conductive layer of claim 14, wherein the atomic ratio of In, In/(In+Zn), is 0.84 to 0.90.

22. The transparent electrically conductive layer of claim 14, wherein the third element is selected from the group consisting of aluminum (Al), antimony (Sb), gallium (Ga) and germanium (Ge).

23. A process for the production of a transparent electrically conductive layer, which comprises dissolving an indium compound, a zinc compound and another compound of at least one other third element having a valence of at least 3 to prepare a coating solution in which the atomic ratio of In, In/(In+Zn), and the atomic ratio of a total amount of the at least one other third element, (total of the at least one third element/(In+Zn+total of the at least one other third element)), are respectively predetermined values, applying the coating solution to a substrate, firing a coating of the solution at 300 to 650° C. and reduction-treating the fired coating to form a transparent electrically conductive layer comprising an amorphous oxide comprising, as main cation elements, indium, zinc and the at least one other third element which is selected from the group consisting of tin (Sn), aluminum (Al), antimony (Sb), gallium (Ga) and germanium (Ge), in which the atomic ratio of In, In/(In+Zn), is 0.50 to 0.8 and the atomic ratio of a total amount of the at least one other third element, (total of the at least one other third element/(In+Zn+total of the at least one other third element)), is 0.2 or less.

24. The process of claim 23, wherein the indium compound is at least one member selected from the group consisting of carboxylic acid salts of indium, inorganic indium compounds and indium alkoxides, and the zinc compound is at least one member selected from the group consisting of carboxylic acid salts of zinc, inorganic zinc compounds and zinc alkoxides.

25. The process of claim 22, wherein the third element is selected from the group consisting of aluminum (Al), antimony (Sb), gallium (Ga) and germanium (Ge).

26. A process for the production of a transparent electrically conductive layer, which comprises providing (A) a target of a sintered body formed of an oxide comprising indium, zinc and at least one other third element having a valance of at least 3, as main components in which the atomic ratio of In, In/(In+Zn), is 0.45 to 0.9 and the atomic ratio of a total amount of the at least one other third element, (total of the at least one other third element/(In+Zn+total of the at least one other third element)), is 0.2 or less, or (B) a target formed of an oxide-containing disk and at least one oxide-containing tablet arranged on the disk, and forming a transparent electrically conductive layer comprising an amorphous oxide comprising indium (In), zinc (Zn) and the at least one other third element which has a valence of at least 3, as main cation elements in which the atomic ratio of In, In/(In+Zn) is 0.50 to 0.90 and the atomic ratio of a total amount of the at least one other third element, (total of the at least one other third element/(In+Zn+total of the at least one other third element)), is 0.2 or less, by a direct sputtering method.

27. The process of claim 26, wherein the target of a sintered body is one selected from the group consisting of a sintered body formed substantially of oxides of indium, zinc and the at least one other third element having a valence of at least 3; a sintered body formed substantially of at least one compound prepared by incorporating the at least one other third element into a hexagonal laminar compound of $In_2O_3(ZnO)_m$ wherein m is 2 to 20; and a sintered body formed substantially of at least one compound prepared by incorporating the at least one other third element into a hexagonal laminar compound of $In_2O_3(ZnO)_m$ wherein m is 2 to 20, and $In_2O_3$ and/or ZnO.

28. The process of claim 26, wherein the formed transparent electrically conductive layer has an atomic ratio of In, In/(In+Zn), of 0.84 to 0.90.

29. The process of claim 26, wherein the third element is selected from the group consisting of aluminum (Al), antimony (Sb), gallium (Ga) and germanium (Ge).

30. An electrically conductive transparent film comprising a transparent polymer substrate in the form of a film or sheet and a transparent electrically conductive layer comprising an oxide containing indium (In) and zinc (zn) as main cation elements in which the atomic ratio of In, In/(In+Zn), is 0.50 to 0.90, the transparent electrically conductive layer being formed on the transparent polymer substrate directly or through a crosslinked resin layer.

31. The electrically conductive transparent film of claim 30, wherein the transparent polymer substrate is a substrate which is formed of one resin selected from the group consisting of a polycarbonate resin, a polyarylate resin, a polyester resin, a polyethersulfone resin, an amorphous polyolefin resin, a polystyrene resin and an acrylic resin, has a thickness of 15 $\mu$m to 3 mm and has a light transmittance of at least 70%.

32. The electrically conductive transparent film of claim 30, wherein the transparent electrically conductive layer is a layer formed by a sputtering method.

33. The electrically conductive transparent film of claim 30, wherein one surface of the transparent polymer which is opposite to a surface of the transparent substrate where the transparent electrically conductive layer is formed, is provided with at least one layer selected from the group consisting of a gas barrier layer, a hard coating layer and an anti-reflection layer.

34. The electrically conductive transparent film of claim 30, wherein at least one crosslinked resin layer of one resin selected from the group consisting of an epoxy resin, a phenoxyether resin and an acrylic resin is provided between the transparent polymer substrate and the transparent electrically conductive layer.

35. The electrically conductive transparent film of claim 34, wherein a gas barrier layer of one selected from the group consisting of an ethylene-vinyl alcohol copolymer, polyvinyl alcohol, polyacrylonitrile, polyvinylidene chloride and polyvinylidene fluoride, is provided between the transparent polymer substrate and the crosslinked resin layer.

36. The electrically conductive transparent film of claim 30, wherein the formed transparent electrically conductive layer has an atomic ratio of In, In/(In+Zn), of 0.84 to 0.90.

37. A process for the production of an electrically conductive transparent film, which comprises providing (A) a target of a sintered body formed of an oxide comprising indium and zinc as main components in which the atomic ratio of In, In/(In+Zn), is 0.45 to 0.9 or (B) a target formed of an oxide-containing disk and at least one oxide-containing tablet arranged on the disk, and forming a transparent electrically conductive layer comprising an amorphous oxide containing indium (In) and zinc (Zn) as main cation elements in which the atomic ratio of In, In/(In+Zn), is 0.50 to 0.90, on a transparent polymer substrate in the form of a film or a sheet directly or through at least a crosslinked resin layer by a direct sputtering method.

38. The process of claim 37, wherein the formed transparent electrically conductive layer has an atomic ratio of In, In/(In+Zn), of 0.84 to 0.90.

39. An electrically conductive transparent film comprising a transparent polymer substrate and a transparent electrically conductive layer comprising an amorphous oxide comprising, as main cation elements, indium (In), zinc (Zn) and at least one other third element having a valence of at least 3, in which the atomic ratio of In, In/(In+Zn), is 0.50 to 0.90 and the atomic ratio of a total amount of the at least one other third element, (total of the at least one other third element/(In+Zn+total of the at least one other third element)), is 0.2 or less, the transparent electrically conductive layer being formed on the transparent polymer substrate directly or through at least a crosslinked resin layer.

40. The electrically conductive transparent film of claim 39, wherein the transparent electrically conductive layer is a layer formed by a sputtering method.

41. The electrically conductive transparent film of claim 39, wherein the formed transparent electrically conductive layer has an atomic ratio of In, In/(In+Zn), of 0.84 to 0.90.

42. The electrically conductive transparent film of claim 39, wherein the third element is selected from the group consisting of aluminum (Al), antimony (Sb), gallium (Ga) and germanium (Ge).

43. A process for the production of an electrically conductive transparent film which comprises providing (A) a target of a sintered body formed of an oxide comprising indium, zinc and at least one other third element having a valence of at least 3 as main components in which the atomic ratio of In, In/(In+Zn), is a predetermined value and the atomic ratio of a total amount of the at least one other third element, (total of the at least one other third element/(In+Zn+total of the at least one other third element)), is a predetermined value, or (B) a target formed of an oxide-containing disk and at least one oxide-containing tablet arranged on the disk, and forming a transparent electrically conductive film comprising an amorphous oxide comprising indium (In), zinc (Zn) and the at least one other third element having a valence of at least 3, as main cation elements in which the atomic ratio of In, In/(In+Zn) is 0.50 to 0.90 and the atomic ratio of a total amount of the at least one other third element, (total of the at least one other third element/(In+Zn+total at least one other third element)), is 0.2 or less, on a transparent polymer substrate in the form of a film or a sheet directly or through at least a crosslinked resin layer by a direct sputtering method.

44. The process of claim 43, wherein the formed transparent electrically conductive layer has an atomic ratio of In, In/(In+Zn), of 0.84 to 0.90.

45. The process of claim 43, wherein the third element is selected from the group consisting of aluminum (Al), antimony (Sb), gallium (Ga) and germanium (Ge).

46. An electrically conductive transparent glass, comprising a transparent glass substrate and a transparent electrically conductive layer comprising an amorphous oxide containing indium (In) and zinc (Zn) as main cation elements in which the atomic ratio of In, In/(In+Zn), is 0.50 to 0.90, the transparent electrically conductive layer being formed on the transparent glass.

47. The electrically conductive transparent glass of claim 46, wherein the transparent electrically conductive layer is a layer formed by a sputtering method.

48. The electrically conductive transparent glass of claim 46, wherein the formed transparent electrically conductive layer has an atomic ratio of In, In/(In+Zn), of 0.84 to 0.90.

49. A process for the production of an electrically conductive transparent glass, which comprises providing (A) a target of a sintered body formed of an oxide containing indium and zinc as main components in which the atomic ratio of In, In/(In+Zn), is 0.45 to 0.9 or (B) a target formed of an oxide-containing disk and at least one oxide-containing tablet arranged on the disk, and forming a transparent electrically conductive layer formed of a substantially amorphous oxide containing indium (In) and zinc (Zn) as main cation elements in which the atomic ratio of In, In/(In+Zn), is 0.50 to 0.90, on a transparent glass substrate by a direct sputtering method.

50. The process of claim 49, wherein the formed transparent electrically conductive layer has an atomic ratio of In, In/(In+Zn), of 0.84 to 0.90.

51. An electrically conductive transparent glass comprising a transparent glass substrate and a transparent electrically conductive layer comprising an amorphous oxide comprising, as main cation elements, indium (In), zinc (Zn) and at least one other third element having a valence of at least 3, in which the atomic ratio of In, In/(In+Zn), is 0.50 to 0.90 and the atomic ratio of a total amount of the at least one other third element, (total of the at least one other third element/(In+Zn+total of the at least one other third element)), is 0.2 or less, the transparent electrically conductive layer being formed on the transparent glass substrate.

52. The electrically conductive transparent glass of claim 51, wherein the transparent electrically conductive layer is a layer formed by a sputtering method.

53. The electrically conductive transparent glass of claim 51, wherein the formed transparent electrically conductive layer has an atomic ratio of In, In/(In+Zn), of 0.84 to 0.90.

54. The electrically conductive transparent glass of claim 51, wherein the third element is selected from the group consisting of aluminum (Al), antimony (Sb), gallium (Ga) and germanium (Ge).

55. An electrically conductive material comprising a powder or a sintered body formed of an oxide comprising indium (In) and zinc (Zn) as main components and includes a hexagonal laminar compound of the formula, $In_2O_3(ZnO)_m$ wherein m is 2 to 20 and having an atomic ratio of In, In/(In+Zn), of 0.1 to 0.9.

56. The electrically conductive material of claim 55, wherein the atomic ratio of indium (In), In/(In+Zn), is 0.50 to 0.90.

57. An electrically conductive material comprising a powder or a sintered body formed of an oxide containing indium (In), zinc (Zn) and at least one other third element having a valence of at least 3, as main components and includes a compound prepared by incorporating the at least one other third element into a hexagonal laminar compound of the formula, $In_2O_3(ZnO)_m$ wherein m is 2 to 20, wherein the atomic ratio of In, In/(In+Zn), is 0.1 to 0.9, and wherein the atomic ratio of a total amount of the at least one other third element, (total of the at least one other third element/(In+Zn+total of the at least one other third element)), is 0.2 or less.

58. The electrically conductive material of claim 57, wherein the atomic ratio of indium (In), In/(In+Zn), is 0.5 to 0.9.

59. The electrically conductive material of claim 57, wherein the third element is selected from the group consisting of aluminum (Al), antimony (Sb), gallium (Ga) and germanium (Ge).

60. A sputtering target comprising a sintered body formed of an oxide comprising indium (In) and zinc (Zn) as main components, said oxide including a hexagonal laminar compound of the formula, $In_2O_3(ZnO)_m$ wherein m is 2 to 20 and having an atomic ratio of indium (In), In/(In+Zn), of 0.1 to 0.9.

61. A sputtering target of claim 60, wherein the atomic ratio of indium (In), In/(In+Zn), is 0.50 to 0.90.

62. A sputtering target comprising a sintered body formed of an oxide comprising indium (In), zinc (Zn) and at least one other third element having a valence of at least 3, as main components, said oxide including a compound prepared by incorporating the at least one other third element into a hexagonal laminar compound of the formula, $In_2O_3(ZnO)_m$ wherein m is 2 to 20, wherein the atomic ratio of indium (In), In/(In+Zn), is 0.1 to 0.9, and wherein the atomic ratio of a total amount of the at least one other third element, (total of the at least one other third element)/(In+Zn+total of the at least one other third element), is 0.2 or less.

63. A sputtering target of claim 62, wherein the atomic ratio of indium (In), In/(In+Zn), is 0.50 to 0.90.

64. The sputtering target of claim 62, wherein the third element is selected from the group consisting of aluminum (Al), antimony (Sb), gallium (Ga) and germanium (Ge).

* * * * *